(12) United States Patent
Goyal et al.

(10) Patent No.: US 9,411,010 B2
(45) Date of Patent: Aug. 9, 2016

(54) SYSTEM FOR INTROSPECTION AND ANNOTATION OF ELECTRONIC DESIGN DATA

(71) Applicants: Pragun Goyal, Cambridge, MA (US); Joseph A. Paradiso, Arlington, MA (US)

(72) Inventors: Pragun Goyal, Cambridge, MA (US); Joseph A. Paradiso, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/506,584

(22) Filed: Oct. 3, 2014

(65) Prior Publication Data
US 2015/0213187 A1    Jul. 30, 2015

Related U.S. Application Data

(60) Provisional application No. 61/886,584, filed on Oct. 3, 2013.

(51) Int. Cl.
| | | |
|---|---|---|
| *G06F 17/50* | (2006.01) | |
| *G01R 31/28* | (2006.01) | |
| *G06Q 10/00* | (2012.01) | |
| *G01R 1/067* | (2006.01) | |

(52) U.S. Cl.
CPC ............ *G01R 31/2834* (2013.01); *G06F 17/50* (2013.01); *G06Q 10/00* (2013.01); *G01R 1/06788* (2013.01); *G01R 31/2806* (2013.01)

(58) Field of Classification Search
CPC .................... G06F 17/5081; G01R 31/2834
USPC .......................................................... 716/136
See application file for complete search history.

(56) References Cited

U.S. PATENT DOCUMENTS

| | | | | |
|---|---|---|---|---|
| 8,150,498 | B2 * | 4/2012 | Gielen ................ | A61B 5/06 382/128 |
| 8,175,681 | B2 * | 5/2012 | Hartmann .......... | A61B 19/5244 128/899 |
| 8,303,502 | B2 * | 11/2012 | Washburn ............ | A61B 8/00 600/424 |
| 2010/0130853 | A1 * | 5/2010 | Chandonnet ......... | A61B 5/06 600/424 |

* cited by examiner

*Primary Examiner* — Sun Lin
(74) *Attorney, Agent, or Firm* — Norma E. Henderson

(57) ABSTRACT

A system for introspection and annotation of electronic design data includes a tracked probe that interacts with an electronic circuit, a tracking system, schematics, design files, or models for the circuit, electronic design system software, and a user interface. The probe has a sensor that tracks the position of the probe within the circuit. The tracking system receives data from the sensor and translates it into coordinates reflecting the location of the probe within the circuit. The software uses the probe coordinates to locate the position of the probe on the circuit schematic, identify the circuit component at the probe location, and display information about the identified component. The displayed information preferably includes an annotated version of the circuit schematic. The system may include a measurement or instrumentation device, the probe may include at least one parameter measurement device, and the display may include information derived from the parameter measurements.

20 Claims, 18 Drawing Sheets

SYSTEM FOR INTROSPECTION AND ANNOTATION OF ELECTRONIC DESIGN DATA

RELATED APPLICATIONS

This application claims the benefit of U.S. Provisional Application Ser. No. 61/886,584, filed Oct. 3, 2013, the entire disclosure of which is herein incorporated by reference.

INCORPORATION BY REFERENCE OF MATERIAL SUBMITTED IN COMPUTER-READABLE FORMAT

This application contains a computer program listing appendix submitted in computer-readable format as an electronically-filed text file under the provisions of 37 CFR 1.96 and herein incorporated by reference. The computer program listing appendix text file includes, in ASCII format, the following files: cairoStuff.py, calibrationLogToMatlab.py, colors.py, config.py, displayClient.py, dummyMultimeter.py, matplottest.py, multimeter.py, pcb.py, pcbView.py, pCloudToMatlab.py, plane.py, plot.py, polhemus.py, probeEvents.py, rawmouse.py, sch.py, schView.py, telnetEngine.py, testPlane.py, testQuaternion.py, and tracking.py.

FIELD OF THE TECHNOLOGY

The present invention relates to electronic design automation and, in particular, to an electronic design system for introspection and annotation of electronic design data.

BACKGROUND

CAD (Computer Aided Design) software allows a circuit design to be described in great detail and at any arbitrary scale. However, the interface to CAD systems is still largely through the traditional avenues of screen, keyboard, and pointing devices. While these interfaces function for their intended purposes, such as text entry, pointing, and browsing, they are not designed for the purpose of mediating the flow of information from and to a physical workpiece. Traditional input interfaces are limited in the sense that they lack a direct connection with the workpiece, forcing the user to translate information gathered from the workpiece before it can be input into the computer. A similar disconnect also exists in the realm of output from the computer. On one extreme, the screen as an output interface forces the user to interpret and translate information conveyed graphically to the context of the workpiece at hand. On the other, devices like CNC machines and 3D printers lack a way for the user to engage with the fabrication and to iteratively change design parameters in real time.

Use of Electronic Design Automation (EDA) software has become quite popular in the design of Printed Circuit Boards (PCBs). A very common paradigm is to design the schematics first and then convert them to a PCB layout. The resulting PCB layout can then be fabricated and assembled with electronic components. Access to the schematic design data of a PCB is quite helpful while testing and assembling a PCB, as it gives the user a good idea of how the components are connected. This becomes even more important while debugging a PCB or while diagnosing a PCB for a fault.

The tools used to work with Printed Circuit Boards (PCBs), such as, for example, soldering iron, multi-meter, and oscilloscope, involve working directly with the board and the board components. However, the Electronic Design Automation (EDA) software used to query a PCB's design data requires using a keyboard and a mouse. These different interfaces make it difficult to connect both kinds of operations in a workflow. Further, the measurements made by tools like a multi-meter have to be understood in the context of the schematics of the board manually.

Production testing of commercial scale PCBs generally employs a custom made multi-wire probe that automatically engages strategic testpoints on the board. The boards are usually extensively manually probed while being tested and debugged. While most modern EDA software offers an easy to use WYSIWYG interface, the keyboard and mouse interface required to query and annotate design data on EDA software creates a disconnect in the workflow of assembling or testing a PCB. This is because most operations and tools used to assemble or test a PCB involve working directly with the circuit board and its components. However, in order to locate a component in the schematic or in the PCB layout, the user either has to try to find a visually similar pattern in the PCB layout file or key in the identifier for the component from the PCB silkscreen annotation. Both of these are cumbersome and lead to unnecessary cognitive load. Small component sizes and similar looking components further magnify this problem.

Experienced electronics designers work their way around this by annotating the board with design data, for example descriptors, part-numbers, component values, etc. However, the board space limits the amount of design information that can be embedded in the annotations Previous work on providing just-in-time information about electronic circuits involves the use of tagged components to track their positions in the circuit [for example, Asgar, Z., Chan, J., Liu, C. & Blikstein, P. LightUp: a low-cost, multi-age toolkit for learning and prototyping electronics. *In Proc. IDC* 2011 225-226]. However, this technique requires specially constructed components.

J. R. R. Louis B. Rosenberg, "Component Position Verification Using a Probe Apparatus" [U.S. Pat. No. 6,195,618, Feb. 27, 2001] describes a position-orientation tracked probe that is used to verify component positions on a circuit board. The Rosenberg device only supports component verification and is built for manufacturing test setups. It does not support annotation and query of all the design data that a circuit board might have, such as schematics, PCB, simulation, and component datasheets. It also does not provide a way to interface with instrumentation to capture, display, and analyze measurements against simulated data.

In the FreeD system [Zoran, Amit & Joseph A. Paradiso. "FreeD—A Freehand Digital Sculpting Tool", Proc. CHI 2013: 2613-2616], a position orientation tracked hand tool is used to provide interaction with the physical work piece and the design data at the same time. However, FreeD does not provide for a way to introspect design data especially design data describing electronic circuits. Also, FreeD does not provide for a way to annotate the design data with measurements made on the workpiece.

An apparatus to perform tests on electronic circuits automatically is described by Rashidzadeh, "Apparatus for the automated testing and validation of electronic components", PCT/CA2012/000214 [WO2012126087]. While this apparatus allows for completely automatic testing and measurements of circuits, it needs to be programmed specifically for the electronic circuit under test and for the particular test.

SUMMARY

An electronic design system for introspection and annotation of electronic design data using the electronic circuit board as an interface according to the invention includes a hand-held probe that allows for direct interaction with the board and board components for just-in-time information on board schematics, component datasheets, and source code. It can also take voltage measurements, which are then annotated on the board schematics. The emphasis is on providing the same kind of interaction with the PCB as is afforded by other commonly used tools.

In exemplary implementations, a system according to the invention aids the user in understanding, repairing, maintaining or designing electronic circuits (e.g., on printed or fabricated otherwise circuit boards). For example, the system may be used to analyze the design data of a circuit board using the circuit board under work itself as the interface. The system can also, or alternatively, be used to annotate the connection schematics with the measurements made on the electronic circuit. The system can further display actual measurements against expected measurements generated by a computer simulation.

In one aspect of the invention, an electronic design system for introspection and annotation of electronic design data includes a tracked probe configured for direct interaction with an electronic circuit, a tracking system, at least one electronic circuit schematic, design file, or model for the electronic circuit, a special-purpose computer processor running electronic design system software, and a user interface. The probe has a pointing tip and at least one tracking sensor for tracking the position of the probe within the electronic circuit. The tracking system receives data from the tracking sensor and translates it into coordinates reflecting the location of the probe within the electronic circuit. The electronic design system software is specially configured to receive the probe coordinates from the tracking system, locate the position of the probe on the electronic circuit schematic, design file, or model, identify, using the located position, a component of the electronic circuit that is interacting with the probe, and create a display of information about the identified electronic circuit component that is presented to the user via the user interface. The display of information preferably includes an annotated version of the electronic circuit schematic, design file, or model.

The probe may include at least one user interface device. The system may include at least one measurement or instrumentation device, the probe may have at least one electronic circuit parameter measurement device, and the electronic design system software may be further specially configured to receive electronic circuit parameter measurements from the measurement or instrumentation device. The display of information may include information derived from the received electronic circuit parameter measurements, and may include an annotated version of the electronic circuit schematic, design file, or model that includes information derived from the received electronic circuit parameter measurements. The electronic design system software may be further configured to process the received electronic circuit parameter measurements. The system may include at least one stored component data sheet or source code listing for the electronic circuit. The system may include an interface to electronic design automation or computer-aided design software configured for producing the stored electronic circuit schematic, design file, or model for the electronic circuit, which may run on the computer processor. The probe tracking sensor may employ magnetic or optical sensing.

In another aspect of the invention, a probe for an electronic design system for introspection and annotation of electronic design data includes at least one pointing tip and at least one tracking sensor for tracking the position of the probe within an electronic circuit and providing the position information to a tracking system configured to receive data from the tracking sensor and to translate the received data into coordinates reflecting the location of the probe within the electronic circuit. The probe may include at least one electronic circuit parameter measurement device. The probe may further include at least one user interface device.

In yet another aspect of the invention, an electronic design system includes electronic design system software running on a special-purpose computer processor, the electronic design system software being specially configured to receive coordinates for the location of a tracked probe that is directly interacting with an electronic circuit, locate the position of the probe on an electronic circuit schematic, design file, or model of the electronic circuit, identify, using the located position, at least one component of the electronic circuit that is interacting with the probe, and create a display of information about the identified electronic circuit component. The system may include a user interface specially configured to present the display of information created by the electronic design system software to a user. The display of information may include an annotated version of the electronic circuit schematic, design file, or model. The electronic design system software may further be specially configured to receive electronic circuit parameter measurements obtained from the electronic circuit by at least one electronic circuit parameter measurement device. The display of information may include information derived from the received electronic circuit parameter measurements.

BRIEF DESCRIPTION OF THE DRAWINGS

Other aspects, advantages and novel features of the invention will become more apparent from the following detailed description of the invention when considered in conjunction with the accompanying drawings wherein.

DETAILED DESCRIPTION

Figure 1:
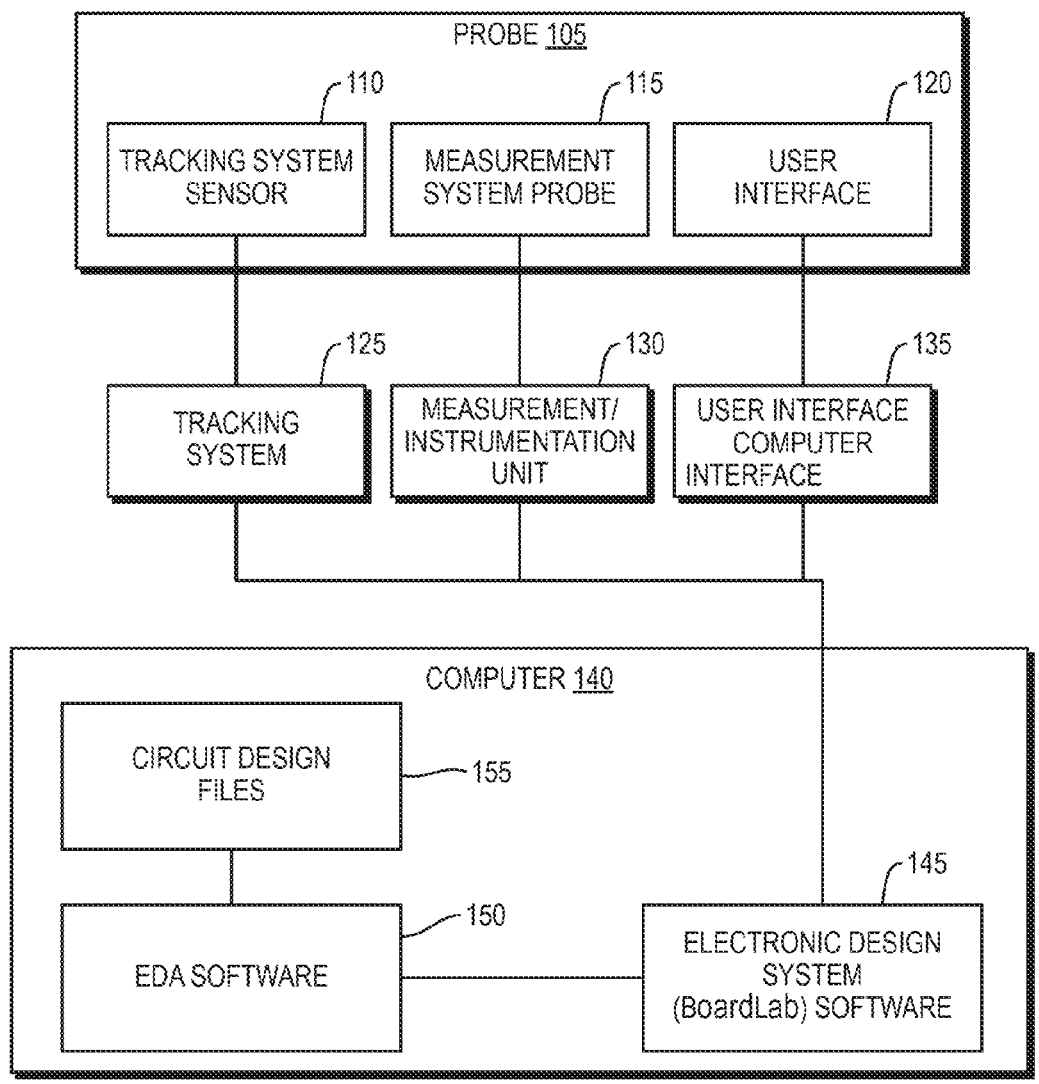
FIG. 1 is an overview block diagram of an exemplary embodiment of an electronic design system for introspection and annotation of electronic design data according to the invention.

An electronic design system for introspection and annotation of electronic design data using the electronic circuit as an interface according to the invention includes a smart, context-aware oscilloscope probe that can be used to dynamically search for just-in-time information on electronic circuit board design data and to automatically annotate the design data with measurements and test data, dependent on the circuit element or node being probed. The prototype implementation is referred to herein as "BoardLab". The handheld probe allows for direct interactions with the PCB for just-in-time information on board schematics, component datasheets, and source code. The probe also can take voltage measurements, which are then annotated on the schematics of the board.

In a system according to the invention, the position and orientation of the tool is tracked with respect to the workpiece. A computer uses the tool position and orientation with a CAD model of the workpiece and actuates the tool automatically depending on the mode of operation and user-triggered events. This allows the user and the handtool to interact with the workpiece in a tight choreography, leveraging craft skills as when exploiting a conventional handtool, while still maintaining a realtime connection with the computer model of the workpiece. The system tracks the position of the test probe relative to the circuit and then displays virtual information about the node or line being probed (such as, but not limited to, expected voltages, waveforms, or schematic elements, associated PCB traces, and component information) in various ways together with, or modified by, the real measurement.

A system according to the invention assists the user with understanding, repairing, maintaining, and/or designing electronic circuits. It may particularly be advantageously employed with printed, fabricated, or otherwise produced circuit boards or circuitry. It provides a means to introspect the design data of a circuit board using the circuit board under work itself as the interface, permits annotation of the connection schematics with the measurements made on the electronic circuit, and permits displaying the actual measurements against the expected measurements generated by a computer simulation.

A system according to the invention, such as the prototype BoardLab, is designed to work with existing semi-complete or complete artifacts. A description of the electronic circuit is loaded into the software in the form of the PCB layout and the schematic data. The system differs from the FreeD system in that the output of the tool is in the form of design information rather than a fabricated workpiece.

The system is designed to be used just like other standard benchtop electronics instrumentation. The user employs a handheld probe to introspect and to make measurements on the circuit board. A computer runs the system software and displays the results on a screen. A tracking system tracks the position and orientation of the probe as the user engages it. As essentially all modern PCBs are generated in an ECAD system that generates a precise mechanical model of the circuit board, node, trace and component placement can be straightforwardly input to the BoardLab system.

FIG. 1 is an overview block diagram of an exemplary embodiment of an electronic design system for introspection and annotation of electronic design data according to the invention. In FIG. 1, probe 105 comprises tracking system sensor 110, measurement system probe 115, and user interface 120. User interface 120 may comprise any of the myriad devices known in the art, including, but not limited to, LEDs, LCD display, buttons, slider, and/or a click-wheel. Tracking system 125, measurement instrumentation unit 130, and user interface computer interface 135 provide the interfaces between tracking system sensor 110, measurement system probe 115, and user interface 120, respectively, and specialized computer processor 140 running special-purpose electronic design system software 145. It will be clear to one of skill in the art that many types of measurement/instrumentation units are suitable for use in the invention including, but not limited to, any or any combinations of an oscilloscope, spectrum analyzer, multimeter, and logic analyzer. It will further be clear to one of skill in the art that user interface computer interface 135 may be any of the many suitable interface types know in the art, including, but not limited to, RS232, USB, Firewire, and Thunderbolt. BoardLab special-purpose software 145 interfaces with EDA software 150 and circuit design files 155, which may also be running or stored on specialized computer processor 140, but which may alternatively be running or stored on a separate device with which specialized computer processor 140 may communicate. Circuit design files 155 may include, but are not limited to, PCB layout files, schematic files, and simulation files. It will be clear to one of skill in the art that a particular embodiment of the invention might use any of many different ways to implement the various components shown in FIG. 1, as long as the flow of information is as described in the diagram.

Figure 2A:
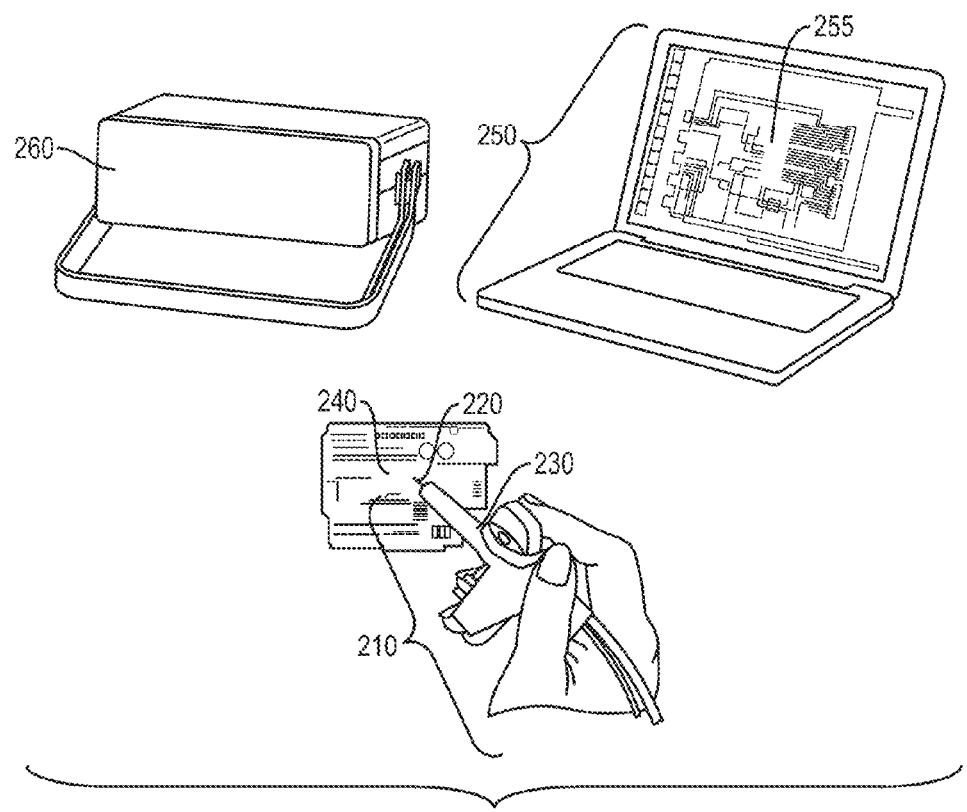
FIG. 2A depicts the components of an exemplary embodiment of an electronic design system according to the invention.
Figure 2B:
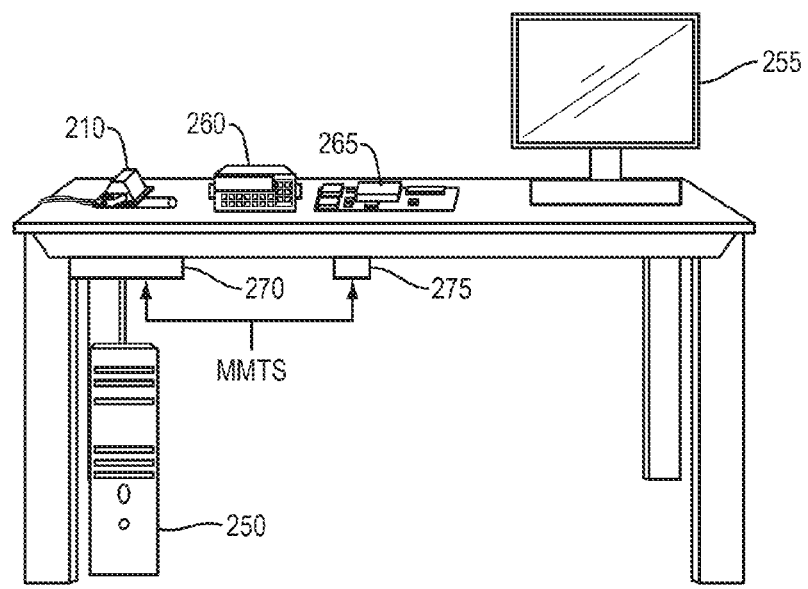
FIG. 2B depicts an exemplary configuration of an electronic design system according to the invention.

FIGS. 2A-B depict two views of an exemplary implementation of an electronic design system according to the invention. In FIG. 2A, the components of an exemplary implementation are one or multiple handheld pointing devices 210, each having conducting pointed tip 220 in a convenient handheld form-factor 230 mounted with a tracking system to estimate the 3D/2D position of the conducting tip with reference to electronic circuit 240. Additional components include specialized computer processor 250 with display 255 specially configured for running special-purpose electronic design system software. Conducting tip 220 of each handheld device 220 is connected to electronic instrumentation unit 260, which in different embodiments can measure any of, but not limited to, voltage, current, resistance, and impedance for electronic circuit 240. FIG. 2B depicts an exemplary working configuration of the components, such as those in FIG. 2A, of an electronic design system according to the invention. Shown in FIG. 2B are handheld probe 210, circuit board 265, multimeter 260, display 255, tracking system 270, transmitter 275, and specialized computer processor 250.

The special-purpose software running on the specialized computer processor takes the measurements made by the measurement unit and the position estimates made by the tracking system as inputs, analyzes the measurement based on the position of the probe, and outputs control signals for controlling one or more transducers. The transducers output humanly perceptible signals that convey information relating to the measurement. For example, the transducers may include a display screen (for example, but not limited to, a display screen that includes a graphical user interface).

The prototype BoardLab implementation has several components, including an external MMTS (magnetic motion tracker system) and an external multi-meter. A Polhemus FASTRAK system (an AC 6D magnetic tracking system) is used to estimate the 3D position and 3D orientation of the probe using a sensor mounted on the probe. A HP-34401A desktop multimeter is used to provide voltage measurements to annotate the schematics. The SCPI (Standard Command for Programmable Instruments) interface is used to communicate with the multimeter. The probe houses a conducting metal tip, which is connected to the positive terminal of the multimeter. The negative terminal of the multi-meter is separately connected to a convenient reference point such as the ground on the PCB. The multimeter is programmatically accessed using the onboard RS232 serial port. The probe also has a small push-button which has to be clicked to make a selection or a measurement.

Any particular embodiment of the invention may display not just raw measurements, but also processed measurements obtained by performing filtering, or by applying time-domain, or frequency domain transformations on the measurements, and analysis of the measurements for specific time domain, frequency domain and statistical features, or by any other suitable method known to one of skill in the art.

An exemplary embodiment of the invention uses buttons mounted on the pointing device as a means for obtaining user input on the operating mode and to trigger the measurement. An alternate embodiment uses a switch activated by depressing the conducting tip to achieve this. Other alternate embodiments do not include buttons on the pointing device, but rather have them mounted somewhere else, or have the user select the mode or trigger for the measurement by having the user interact with the micro-computer using a keyboard, mouse, joystick, or any other suitable means known in the art. Another embodiment uses the position tracking system and/or an accelerometer to detect user input by means of detecting user gestures.

An embodiment of the invention uses active or passive magnetic sensing to estimate the position and orientation of the tip. Another embodiment uses an optical tracking system to achieve this. Another embodiment uses a camera mounted on the probe to detect features of the electronic circuit and uses this to estimate the position of the tip in reference to the detected features. Another embodiment uses specifically designed marks and/or conductive traces on Printed Circuit Boards that are sensed by the probe optically or capacitively.

In an embodiment of the invention, the measurements made by the pointing device and their analysis are mapped to their respective 3D positions on the electronic circuit. The special-purpose software analyzes these measurements, computes a partial or full model of the electronic circuit, and suggests the model to the user in the form of a graphic of the connection schematic. The connection schematic may use standard symbols for electronic components. The user can then use the same handheld device or any other computer interface to interactively edit the suggested circuit to obtain the desired circuit. This embodiment may particularly be useful for understanding how a circuit works. It can also be used to create/edit a computer model of an existing physical electronic circuit, which model of the electronic circuit may then be used to further make more copies of the circuit.

In another embodiment of the invention, the measurements and their analysis can be mapped on the existing computer design models describing the electronic circuit under inspection. An advantage of this, as compared to displaying the measurements and/or their analysis on a standalone device as typically is the case with instrumentation units such as oscilloscopes, multimeters, spectrum analyzers, and logic analyzers, is that the measurements can be displayed in a way to indicate which connections on the schematic are they made between. This makes it easy to understand the measurement in the context of the electronic circuit.

Another embodiment of the invention can operate in a mode in which a user can point the device to a feature, such as, for example, an electronic component, or a connecting wire or a trace on the circuit board, and the display will highlight the sections of the circuit schematic connected to or otherwise related to the circuit feature being pointed to. Likewise, a manufacturer data-sheet for the component can be displayed. In the case of circuits containing digitally programmable components, parts of the program that affect the state of the feature or the component can be highlighted. This embodiment may be particularly useful to introspect and develop an understanding of the connection schematic of an electronic circuit using already existing computer design data and also to develop an understanding of the components used in an electronic circuit.

Figure 3:
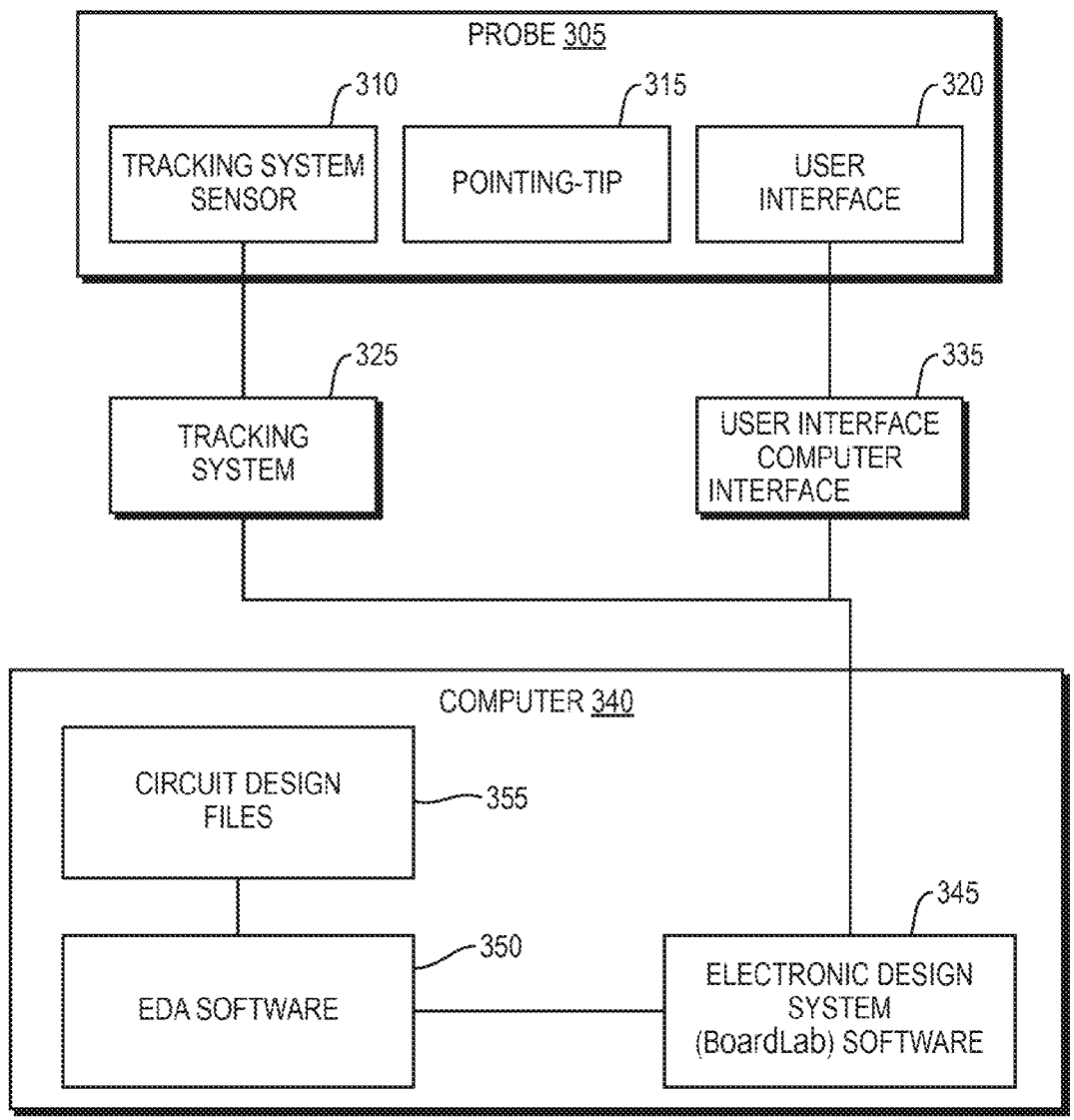
FIG. 3 is an overview block diagram of an exemplary embodiment of an electronic design system according to an alternative embodiment of the invention.

Many variations in specific implementation details will be clear to one of skill in the art and are within the contemplated scope of the invention. For example, FIG. 3 is an overview block diagram of an exemplary embodiment of an electronic design system according to an alternative embodiment of the invention. In the embodiment of FIG. 3, measurement related components are absent. This implementation of the invention will still provide utilities such as looking up for a circuit board component in the design data, but without allowing measurements to be taken and annotated on the schematics by the unit. In this implementation, the measurement unit probe-tip is replaced by a pointing-tip to allow the user to use the probe to point and click on components in the circuit board. Shown in FIG. 3 are probe 305, comprising tracking system sensor 310, pointing-tip probe 315, and user interface 320. Tracking system 325, and user interface computer interface 335 provide the interfaces between tracking system sensor 310 and user interface 320, respectively, and specialized computer processor 340 running BoardLab special-purpose software 345. BoardLab special-purpose software 345 interfaces with EDA software 350 and circuit design files 355

In some embodiments of the invention, the measurements and analysis are displayed against the expected measurements and analysis based on the connection schematic of the circuit. Previous measurements made by the probe can be used to simulate the expected behavior of the circuit to generate expected measurements. This embodiment may be useful for testing an electronic circuit for compliance with expected behaviors.

In one embodiment, the probe itself is mounted with a display to provide the information. In another embodiment, the display is mounted to the workspace. In another embodiment, the information is projected on the workspace using a projector. In another embodiment, the information is displayed on a wearable display worn by the user.

In some implementations, the probe is integrated with a circuit simulation tool (such as, but not limited to, SPICE®) Annotating the measured value against the expected (simulated) voltage can aid the user in testing. In some implementations, multiple handheld probes are used. This allows for measurements like impedance to be annotated on the schematics.

An embodiment of the invention might allow the user to trigger events by using a foot switch.

In exemplary implementations, the invention includes one or more processors for (i) receiving signals indicative of human input or sensor measurements, (ii) analyzing data and performing computations, and (iii) outputting control signals for controlling one or more transducers (e.g., a display screen). For example, all of these functions (including any such function explicitly stated or implied in the above description of this invention), may be performed by these one or more processors. The processors may be arranged in any configuration and may be connected to each other and other hardware in the system in any configuration. For example, at least some of the processors may be housed in a microcontroller.

Figure 4:
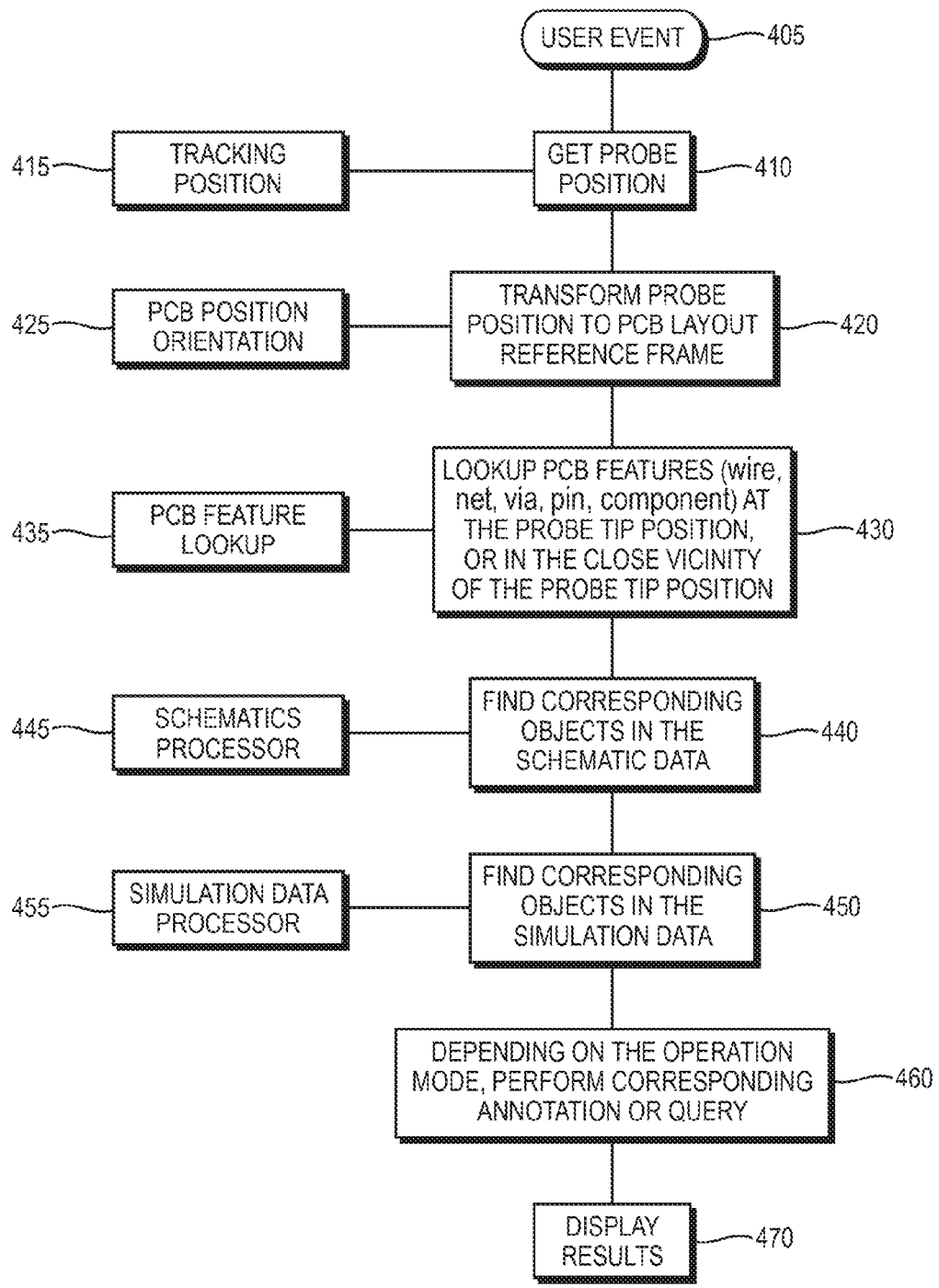
FIG. 4 is a flowchart depicting the operation of an exemplary embodiment of an electronic design system according to an embodiment of the invention.

FIG. 4 is a flowchart depicting the operation of an exemplary embodiment of an electronic design system according to an embodiment of the invention, along with the special-purpose software components that perform each action. In FIG. 4, the user initiates 405 an event, causing the system to obtain 410 the probe position using tracking system 415. The probe position is transformed 420 to a PCB Layout reference frame by PCB position orientation subsystem 425. The PCB features, such as, but not limited to, wire, net, via, pin, or component, that are in close proximity to the probe tip position are identified 430 by PCB feature lookup subsystem 435 and the corresponding objects in the schematic data are found 440 by schematics processor 445. Corresponding objects are found 450 in the simulation data by simulation data processor 455 and then, depending on the operation mode, one or more annotation and/or query are performed 460 and results are displayed 470.

The novel handheld probe presents one of the many advantages of the system of the invention. A probe according to this aspect of the invention is a direct interface to the PCB in order to obtain information on board schematics, component datasheets, source code, and voltage measurements. The position and orientation of the handtool is tracked with respect to the PCB and may be actuated automatically depending on the mode of operation and user-triggered events. This allows the user and the handtool to interact with the PCB while still maintaining a realtime connection with the computer model of the PCB.

Figure 5A:
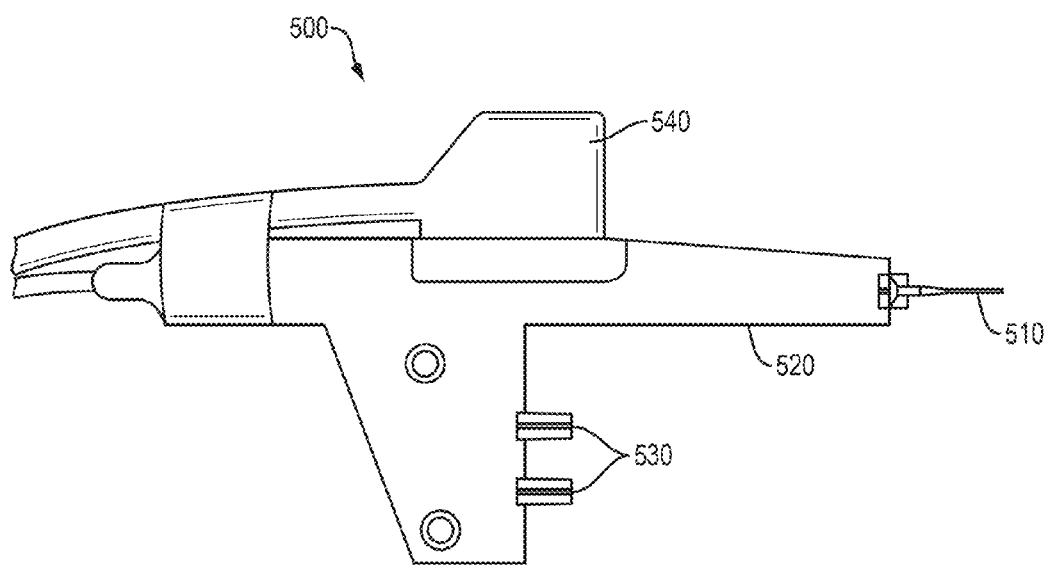
FIG. 5A is a side view of an exemplary handheld probe according to one aspect of the invention.
Figure 5B:
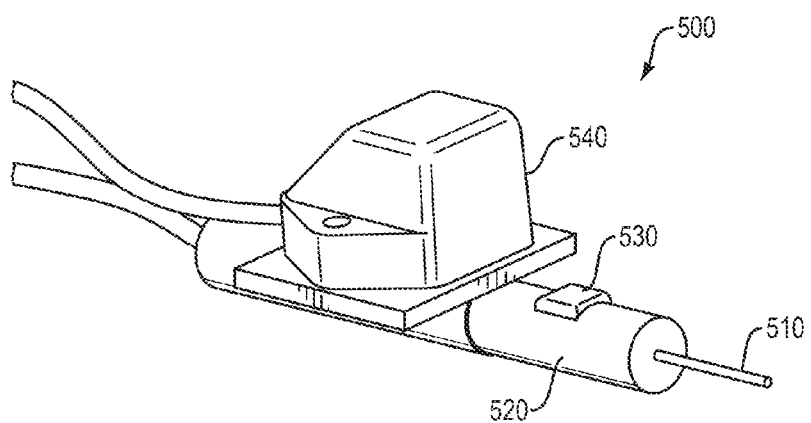
FIG. 5B is a perspective view of an exemplary handheld probe according to one aspect of the invention.

FIGS. 5A and 5B are side and perspective views, respectively, of an exemplary handheld probe according to one aspect of the invention. Shown in FIG. 5A are handheld probe 500, having conducting pointed tip 510 in a handheld form-factor 520, one or more mode and/or action buttons 530, and on-board tracking system 540.

Figure 6A:
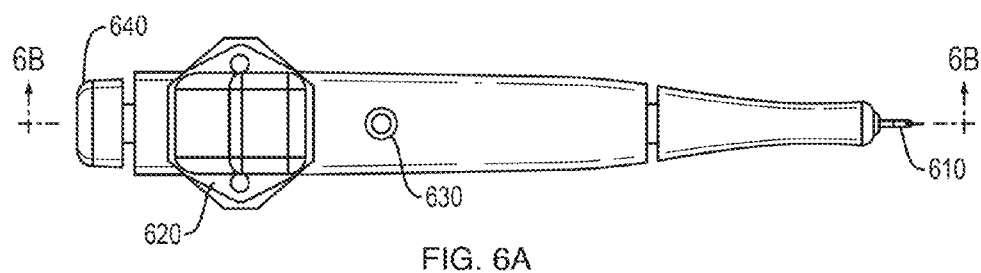
FIGS. 6A and 6B are schematic drawings of the top (FIG. 6A) and side (FIG. 6B) of an exemplary handheld probe according to one aspect of the invention.
Figure 6B:
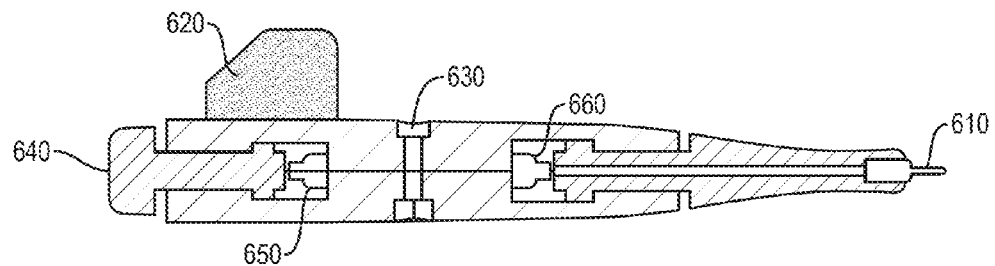

FIGS. 6A and 6B are schematic drawings of the top (FIG. 6A) and side (FIG. 6B) of an exemplary handheld probe according to one aspect of the invention Shown in FIGS. 6A-B are probe tip 610, magnetic tracking system sensor 620, optional status LED 630, mode button 640, mode button microswitch 650, and action microswitch 660. In the prototype, mode button 640 and mode button microswitch 650 are used for switching between modes. It will be clear to one of skill in the art that mode button 640 and mode button microswitch 650 may be programmed to any software function. Microswitch 660 is used to trigger an action such as a measurement or a component lookup. Microswitch 660 is depressed when probe tip 610 is pressed in.

In the prototype implementation, the probe (FIGS. 6A-B) has a conductive metal tip, which is connected to the positive terminal on a desktop multimeter to make measurements. The probe tip is mounted on a spring-loaded switch, which closes when the probe is pressed onto the board. The probe has another switch that can be used to cycle through different modes of operation when pressed. The switches are connected to an Arduino microcontroller board programmed as a USB HID device. The Arduino generates computer keyboard events for switch events on the probe. The probe also has a LED that indicates the current mode of operation. The LED is controlled by the Arduino.

Figure 7:
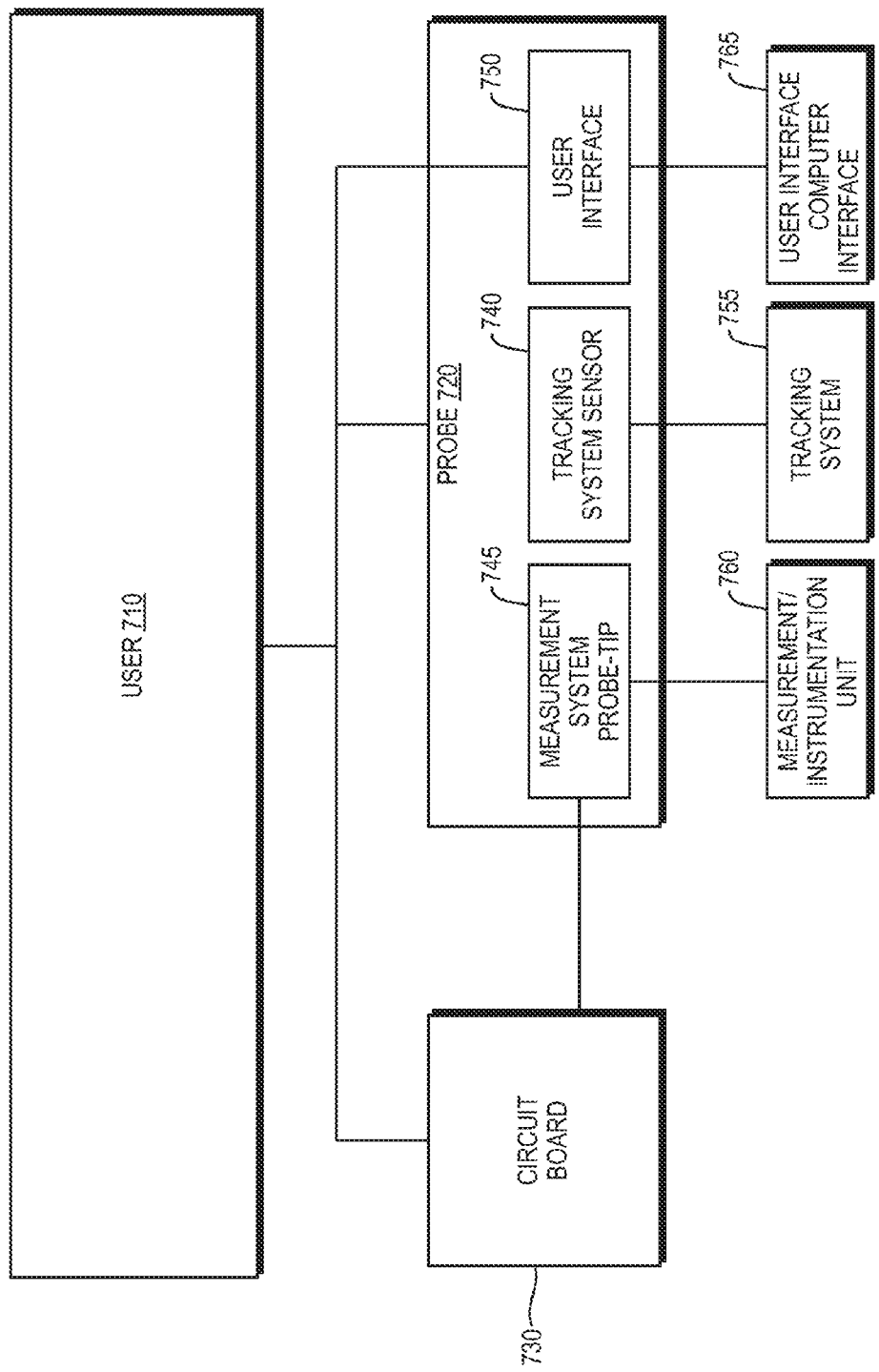
FIG. 7 is a block diagram of an exemplary embodiment of a handheld probe and measurement system according to an aspect of the invention.

FIG. 7, which is a block diagram of an exemplary embodiment of a handheld probe and measurement system according to an aspect of the invention that is also shown in FIG. 1, shows these connections conceptually. In FIG. 7, user 710 interacts directly with probe 720 and circuit board 730. Probe 720 comprises tracking system sensor 740, measurement system probe 745, and user interface 750, which interface with Tracking system 755, measurement instrumentation unit 760, and user interface computer interface 765, respectively.

Figure 8:
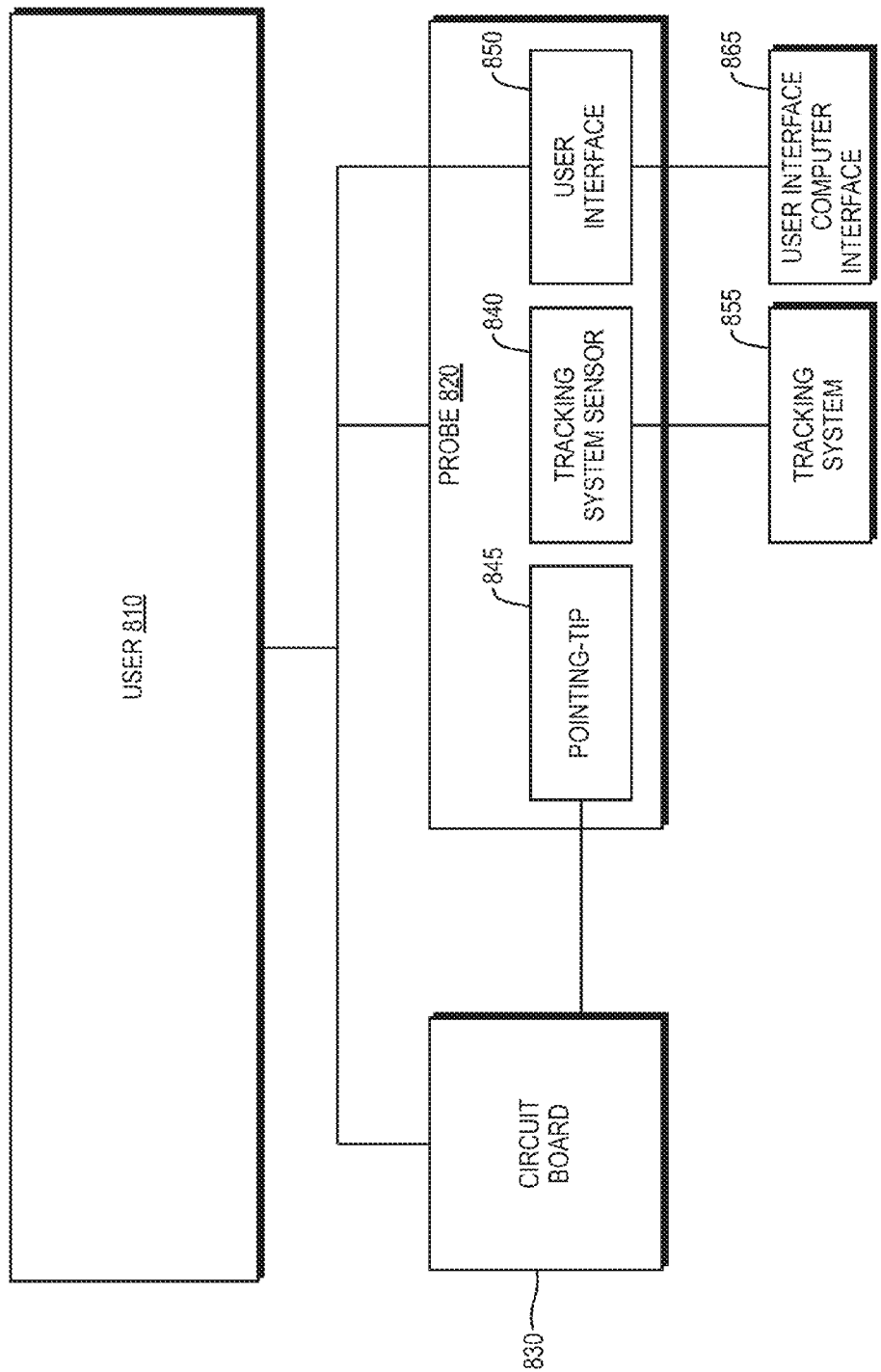
FIG. 8 is a block diagram of an alternative exemplary embodiment of a handheld probe according to an aspect of the invention.

FIG. 8 is a block diagram of an alternative exemplary embodiment of a handheld probe that does not employ an instrumentation system, but does have a pointing-tip to point and click on components. In FIG. 8, also shown in FIG. 3, user 810 interacts directly with probe 820 and circuit board 830. Probe 820 comprises tracking system sensor 840, pointing-tip probe 845, and user interface 850. Tracking system 855 and user interface computer interface 865 interface with tracking system sensor 840 and user interface 850, respectively.

The simple mechanical function of the probe is holding the tracking sensor, the probe-tip and the user interface buttons. However, there are several constraints that govern the probe design. Since the probe is used for such fine work, it is designed to be used with the fingertips, and hence cannot be bulky. The probe must also provide for a way to mount the tracking sensor rigidly with respect to the probe-tip. A small amount of compliance/flex in the probe that allows for the tracking sensor to move with respect to the probe-tip would introduce positioning errors in the estimated position of the probe tip. Given that the probe is expected to distinguish PCB features that can be as small as 0.5 mm, even small angular displacement of the tracking sensor with respect to the probe tip would result in the software estimating the probe tip to be making a measurement at completely different pin/net/trace than the one it is actually used on, rendering the system useless at what it is designed for. In experiments, it was found that the torque applied by wires exiting the probe on the tracking sensor was enough to cause such misalignment. This was fixed by redesigning the probe with a cable exit mount, this ensures that the forces applied by the wires and cables exiting from the probe are channeled into the probe body.

One of the basic mechanical requirements of the probe is to provide for a solid rigid mechanical connection between the probe tip and tracking sensor. However, it will be clear to one of skill in the art that many alternative configurations are suitable for use in the system. For example, in one alternative embodiment, the probe tip slides in a cylindrical cavity inside the main probe body. This construction, especially when done in plastic, allows for a large amount of angular play in the probe tip assembly with respect to the main probe body. This could also be changed so that the probe tip assembly be the same mechanical body as the sensor mount, and the part of the probe that is held by the fingers be constructed in such a way to slide on the probe assembly. Also, an RGB LED on the probe could be an effective means to communicate to the user about the current system state. It will be clear to one of skill in the art that the probe can also have more than one conductor on the tip, as in a logic probe.

One particularly useful embodiment of the probe, employed in the prototype implementation, employs a spring-loaded probe-tip that can be depressed by the user to trigger a lookup/measurement action. However, again, since the probe is expected to help distinguish between features that might not be farther than 0.5 mm, or even less, a small amount of play in the spring-loaded mechanism can render the probe useless for this. One of the solutions to this problem is to mount the probe-tip and the tracking sensor on one rigid platform that moves as one spring-loaded unit against the rest of the handset, thus making sure that the probe-tip and the sensor are rigidly coupled.

Electronic design system software. In the prototype implementation, the Arduino board, the multimeter, and the tracking system are connected to the specialized computer processor that runs the BoardLab software. The software was written in python 2.7 and runs on a PC with 4 GB of RAM and a quad-core Intel processor running on Ubuntu 12.04. The prototype software implementation is found in the computer program listing appendix of this application and is herein incorporated by reference. The software parses the design of the PCB and the associated schematic from Eagle 6.0 .brd and .sch files respectively. The board file (.brd) is parsed to create a layout map of all the features of the PCB. The position and orientation of the probe is used to compute the position of the tip. The position of the tip is then overlaid on the PCB map to identify the PCB feature to which the probe is pointing.

The prototype implementation of the system has its own rendering system to render the schematics and the PCB layout, but it will be clear to one of skill in the art that the software could be redesigned to work as a plugin with the EDA software, allowing the rendering to be taken care of by the EDA software. This would also permit the user to keep using a software package with which they are already familiar.

The software can be organized in different ways, all of which are suitable for use in the system of the invention. In one implementation, shown in FIG. 9, the system includes a circuit board design data display interface (PCB Layout, Simulation, Schematics) and a display for the measurement data.

Figure 9:
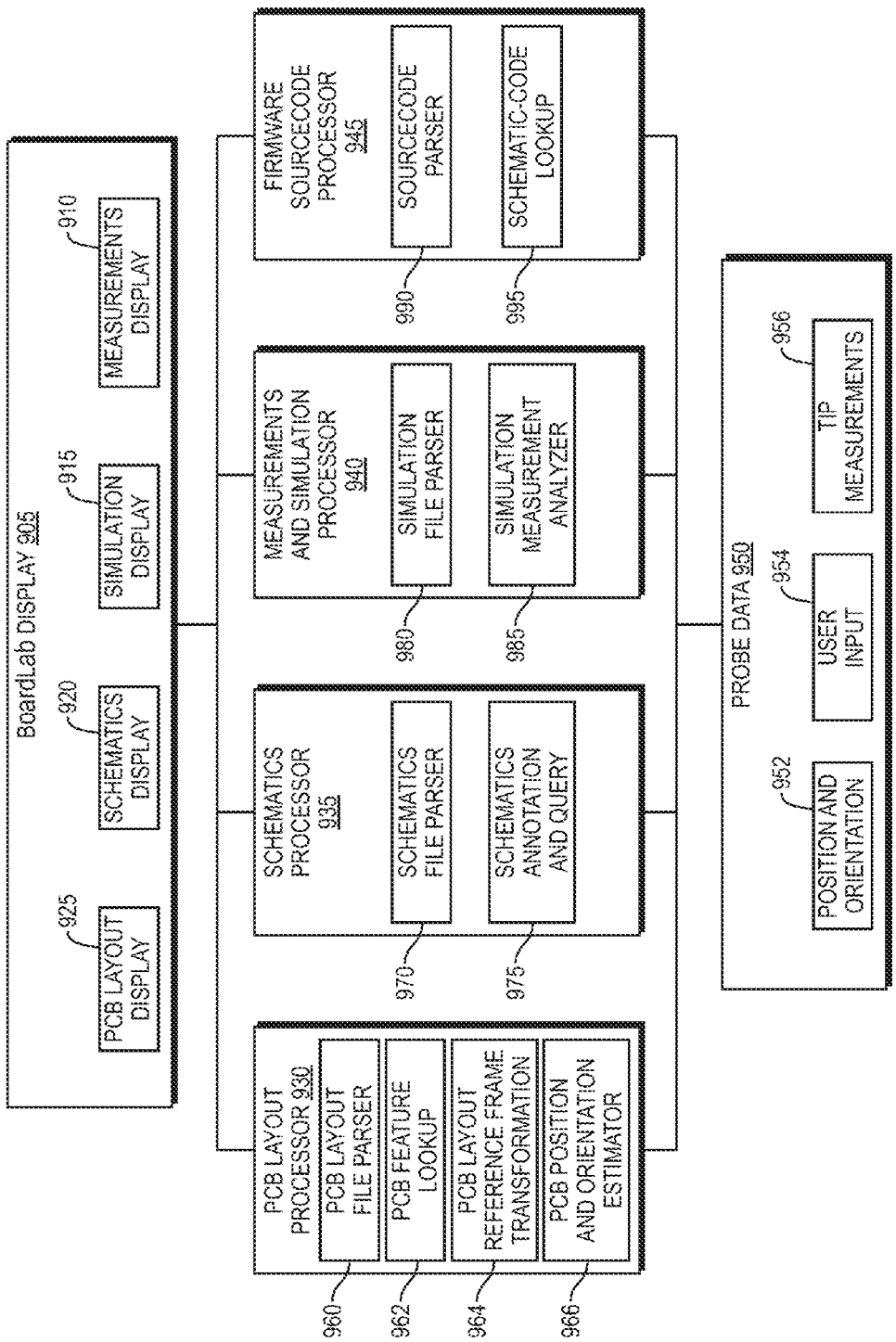
FIG. 9 is a block diagram of an exemplary embodiment of the software components of an exemplary electronic design system according to an aspect of the invention.

FIG. 9 is a block diagram of an exemplary embodiment of the software components of an exemplary electronic design system. In FIG. 9, Boardlab display 905, comprising measurements display 910, simulation display 915, schematics display 920, and PCB layout display 925, is connected to PCB layout processor 930, schematics processor 935, measurements and simulation processor 940, and firmware sourcecode processor 945, which elements receive and use probe data 950, including position and orientation data 952, user inputs 954, and tip measurements 956, from the probe. In this embodiment, PCB layout processor 930 comprises PCB Layout file parser 960, PCB feature lookup subsystem 962, PCB Layout reference frame transformation subsystem 964, and PCB position and orientation estimator 966. Schematics processor 935 comprises Schematics file parser 970 and Schematics annotation and query subsystem 975. Measurements and simulation processor 940 comprises Simulation file parser 980 and Simulation measurement analyzer 985, and firmware sourcecode processor 945 comprises Sourcecode parser 990 and Schematic code lookup subsystem 995.

Such an implementation provides a partial utility as provided by EDA software, wherein the design data display does not support editing the circuit board design. Such an implementation might be useful when the system is intended to be used for circuit board introspection and measurement. Such functionality would be useful in prototyping workspaces, wherein the user would use the system to look up information from the design, or to understand measurements. In this implementation, the invention would include PCB Layout file, Schematics file, and other file parsers to import the design data for the circuit board from their respective files.

Figure 10:
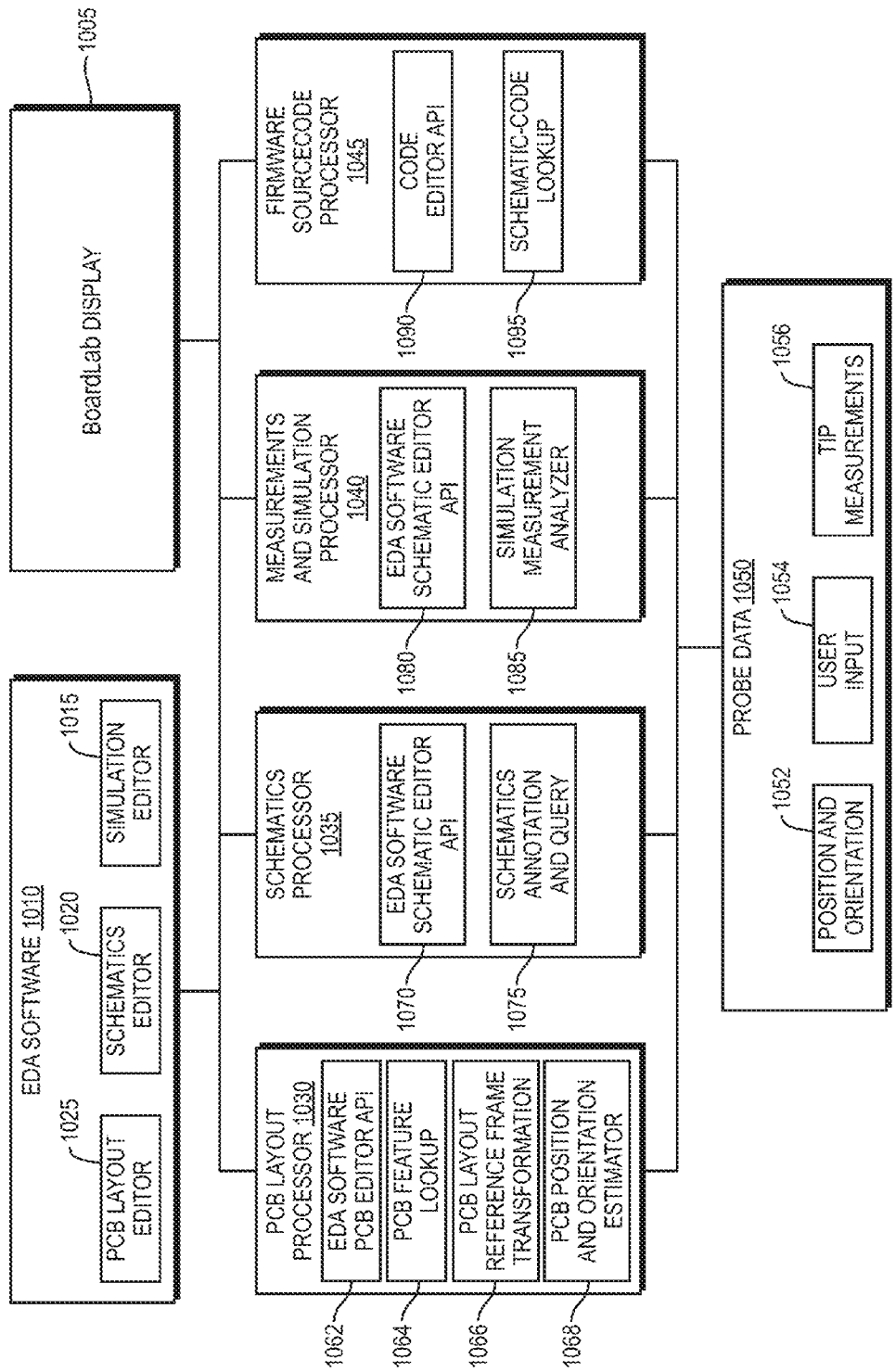
FIG. 10 is a block diagram of an alternative exemplary embodiment of the software components of an exemplary electronic design system according to an aspect of the invention.

An alternative embodiment of the system, shown in the exemplary embodiment of FIG. 10, is co-dependant on existing EDA software. This implementation interfaces with existing/third party EDA software to provide for added functionality from within the overall user interface of the EDA software. Examples of such software include, but are not limited to, Eagle, Altium, Procad, SPICE, and PADS PCB. In this implementation, the system uses the API (Application Programming Interface) exposed by the EDA software to access the design data within the editor applications (for example, but not limited to, the PCB layout editor and/or the schematic editor). Such an implementation allows use of the invention with the design software. An example of such use might include clicking on a component on a circuit board to search for the symbol for the component in the schematics or the PCB layout. Such an implementation would be particularly useful in situations wherein access to the full editing functionality provided by EDA software is required in addition to just displaying the design data.files. The invention might use its own display for data not supported by the EDA software.

FIG. 10 is a block diagram of an alternative exemplary embodiment of the software components of an exemplary electronic design system. In the implementation of FIG. 10, the system uses host EDA software API to query for the PCB features present at the probe position instead of loading them from the files (for instance). In FIG. 10, Boardlab display 1005 and EDA software 1010, comprising simulation editor 1015, schematics editor 1020, and PCB layout editor 1025, are connected to PCB layout processor 1030, schematics processor 1035, measurements and simulation processor 1040, and firmware sourcecode processor 1045, which elements receive and use probe data 1050, including position and orientation data 1052, user inputs 1054, and tip measurements 1056, from the probe. In this embodiment, PCB layout processor 1030 comprises EDA software PCB editor API 1060, PCB feature lookup subsystem 1062, PCB Layout reference frame transformation subsystem 1064, and PCB position and orientation estimator 1066. Schematics processor 1035 comprises EDA software schematics editor API 1070 and Schematics annotation and query subsystem 1075. Measurements and simulation processor 940 comprises EDA software Simulation editor API 1080 and Simulation measurement analyzer 985, and firmware sourcecode processor 1045 comprises Code editor API 1090 and Schematic code lookup subsystem 1095.

It will be clear to one of skill in the art that the software for the system can be written in any combination of computer programming languages, such as, but not limited to, C, C++, Python, Java, JavaScript, and Lisp. Further, the software could be supported on many different computing platforms, such as, but not limited to, ARM, X86, X64 and operating systems like GNU/Linux, OSX, Windows, etc. The prototype software was written in python 2.7 and runs on a PC with 4 GB of RAM and a quad-core Intel processor running on Ubuntu 12.04. The software parses the design of the PCB and the associated schematic from Eagle 6.0 .brd and .sch files respectively.

The board file is parsed to create a layout map of the all the features of the PCB. The position and orientation of the probe is used to compute the position of the tip. The position of the tip is then overlaid on the PCB map to identify the PCB feature being pointed to by the probe. Each component in the board and schematic files has a unique identifier; this identifier is used to identify, for each physical component on the PCB, the associated schematic symbol.

The system has several operating modes: board positioning mode, component selection mode, voltage annotation mode, code highlight mode, and waveform verification mode. In some embodiments, the modes can by cycled through by double clicking the button on the probe.

Board positioning mode. The tracking system tracks the position of the probe with respect to the work table, as the tracking system transmitter is mounted rigidly on the work table. The position and orientation of the probe need to be transformed to the coordinate system used on the circuit board. The board-positioning mode is a way for the user to tell the system where the circuit board is located on the work table.

In order to position the board, the user clicks the probe tip on three or more preselected via holes on the circuit board. The tip position and orientation data is then used to find the plane of the circuit board. Once the plane is determined, a least squares 2D point cloud match is applied to calculate the displacement of the origin and the angle by which it should be rotated in the plane. This process generally takes a user approximately 1-2 minutes to complete. The probe tip vector is projected on the PCB plane to estimate where coordinates of the probe point on the PCB.

Figure 11:
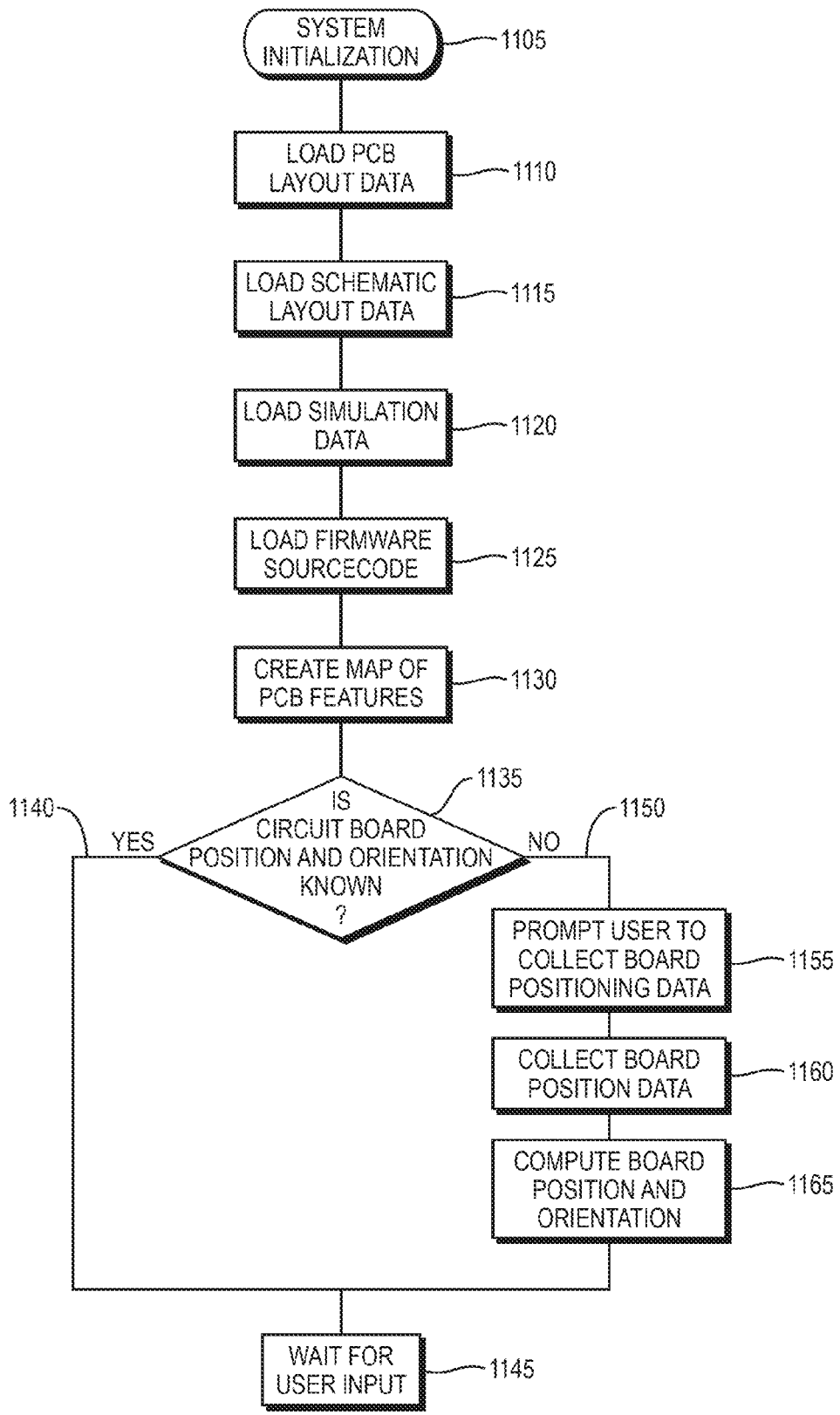
FIG. 11 is a flowchart of an exemplary startup (board positioning) process for an exemplary electronic design system according to the invention.

FIG. 11 is a flowchart of a generalized exemplary board positioning (startup) process for an exemplary independent implementation of an electronic design system according to the invention. In FIG. 11, after system initialization 1105, PCB layout data is loaded 1110, schematic layout data is loaded 1115, simulation data is loaded 1120, firmware sourcecode is loaded 1125, and a map of PCB features is created 1130. The system determines whether the circuit board position and orientation are known 1135 and, if so 1140, it waits 1145 for user input. If not 1150, the user is prompted 1155 to collect board positioning data, board positioning data is collected 1160, and board position and orientation are computed 1165, after which the system waits 1145 for user input.

Component Selection Mode. In the component selection mode, the probe allows the user to select a single component. In this mode, the view highlights the selected component in the schematic. The motivation is to help the user understand the component's connections with other components. If the component has a datasheet attribute, the view also loads the datasheet for the component.

Figure 12:
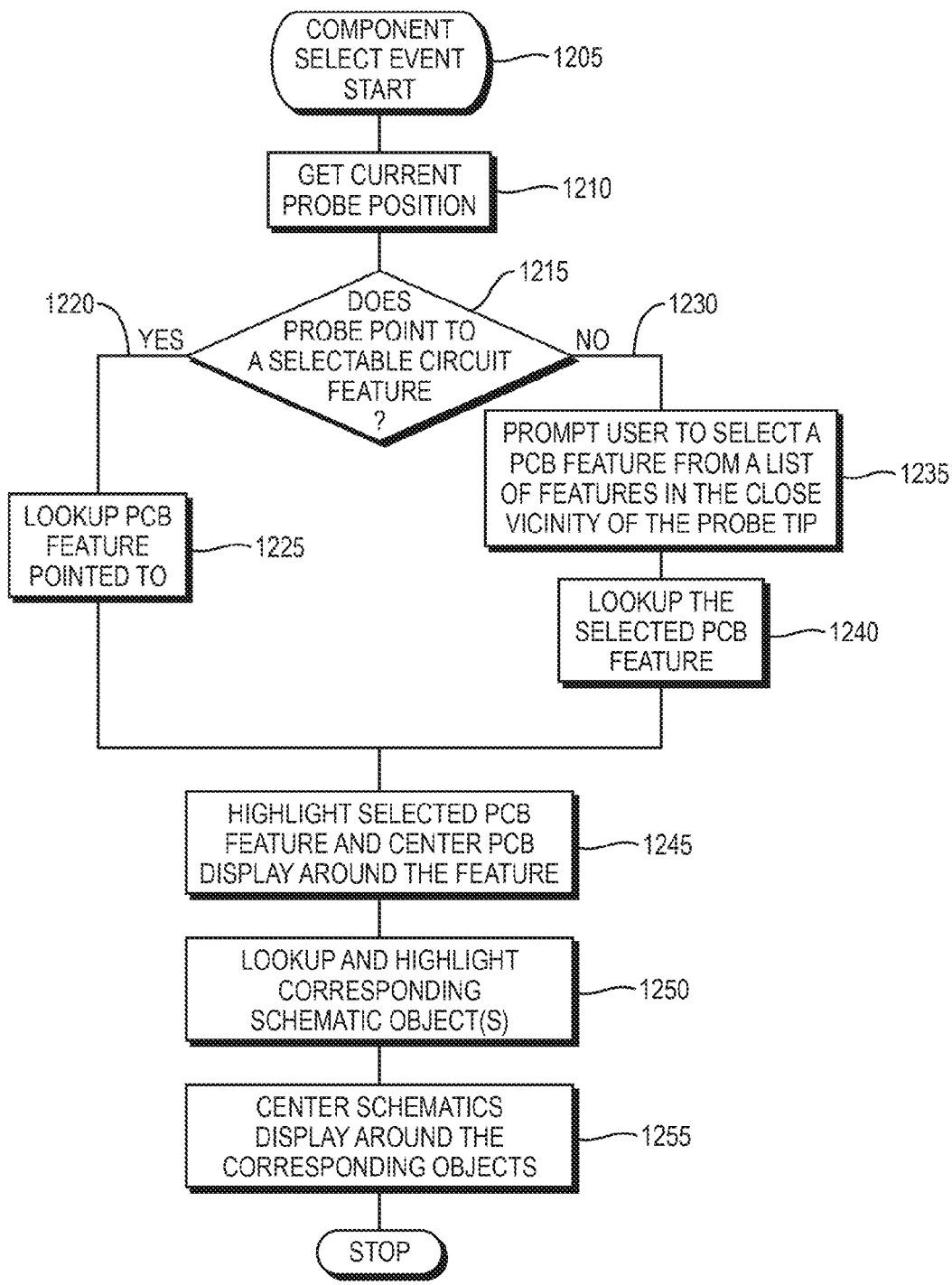
FIG. 12 is a flowchart of an exemplary component select event according to the invention.

FIG. 12 is a flowchart of an exemplary component select event according to an exemplary implementation of the system of the invention. In FIG. 12, the component select event is initialized 1205, and the current probe position is obtained 1210. The system determines 1215 whether the probe points to a selectable circuit feature. If so 1220 the PCB feature pointed to is looked up 1225. If not 1230, the user is prompted 1235 to select a PCB component from a list of the components in the close vicinity of the probe tip, and then the PCB feature pointed to is looked up 1240. Once the feature has been looked up, the selected PCB feature is highlighted 1245 and the PCB display is centered around the feature. The corresponding schematic objects are then looked up and highlighted 1250, and the schematics display is centered around the corresponding objects 1255.

Voltage annotation mode. Over the course of testing a PCB, a user might make many measurements of voltage across different nodes on the circuit. Conventionally, the user has had to manually understand what a measurement made on the PCB means in the context of the schematic. The voltage annotation mode allows for automatic annotation of the schematic with the voltage measured using the probe.

Figure 13:
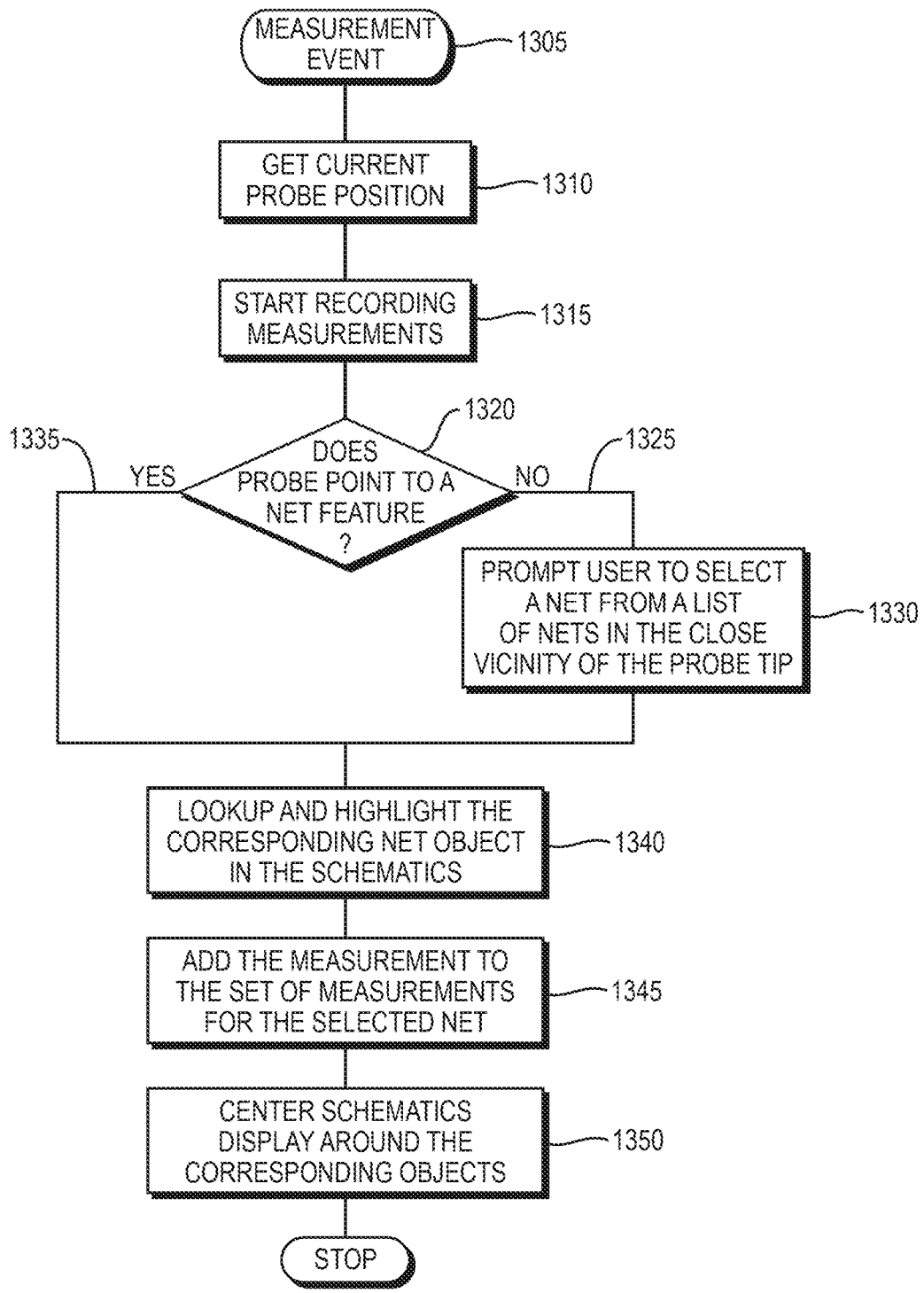
FIG. 13 is a flowchart of an exemplary measurement event according to the invention.

FIG. 13 is a flowchart of an exemplary measurement event according to the invention. In FIG. 13, the measurement event is initiated 1305, the current probe position is obtained 1310, and measurement recording is started 1315. The system determines 1320 whether or not the probe points to a NET feature. If not 1325, the user is prompted 1330 to select a net from a list of nets in the close vicinity of the probe tip. Afterwards, or if the system had previously determined that the probe does point 1335 to a NET feature, the corresponding NET object is looked up and highlighted 1340 in the schematics. The measurement is then added 1345 to the set of measurements for the selected NET, and the schematics display is centered 1350 around the corresponding objects.

Code highlight mode. Microcontrollers are quite commonly used in modern electronic circuits. Most microcontrollers are programmed in languages like assembly, C, C++, Java, etc. The code highlight mode allows the user to introspect the code related to a net or a trace on the PCB by highlighting the lines of code that refer to the pin of the microcontroller connected to the net. This makes the probe a physical interface to query the firmware code for a circuit board. In the prototype implementation, this feature supports standard Arduino boards running Arduino sketches.

Waveform verification mode. Oftentimes, circuit board design allows for simulating sections of the circuit board to generate expected waveforms. In the waveform verification mode, the expected waveform at the measurement point is plotted with a graph of real measurements.

Tracking system. The handheld probe is augmented with a MMTS (magnetic motion tracking system) sensor that allows for tracking of the 3D position and 3D orientation of the probe. A Polhemus FASTRAK system (an AC 6D magnetic tracking system) is used to estimate the 3D position and 3D orientation of the probe using a sensor mounted on the probe. The position and orientation state given by the tracking system is translated to get the position of the tip in the reference frame of the workbench. The Polhemus system can be configured to output the orientation data as a quaternion. The following equation is used to get the position of the tip ($\vec{r}_{tip,tx,tx}$) with respect to the transmitter (tx), in the reference frame of the transmitter (tx).

$$\vec{r}_{tip,tx,tx} = \vec{r}_{rx,tx,tx} + M * \vec{r}_{tip,rx,rx}$$

where $\vec{r}_{tip,rx,rx}$ is the vector from the receiver (rx) on the probe to the tip (tip) of the probe in probe reference system (rx), and M is the 3×3 rotation matrix derived from the orientation quaternion given by the tracking system.

While the CAD design of the probe could be used to compute the vector that connects the sensor origin to the tip's endpoint, it is better to calibrate for the vector because of 3D printing tolerances and slight misalignment of the sensor on the probe. The following procedure is used to collect calibration data:

1. The tip of the probe is held fixed to a via (e.g. through-hole) in the board.
2. The probe is moved around making sure that the tip is always touching the via.

Assuming that the sensor is rigidly mounted on the probe, and ignoring the small movement of the tip within the via, the resulting set of position points should lie on the sphere centered at the via and with a radius equal to the vector ($\vec{r}_{tip,rx}$). The center (center) and radius ($\vec{r}_{tip,rx}$) of the sphere can be found by importing the point cloud in a CAD program (Rhinocerous) and fitting a sphere to the points. The following equation gives the $r_{rx}{}^i$, for point i in the pointcloud in the reference frame of the transmitter (tx). However, as the orientation information is known for each point, the inverse of the rotation matrix derived from the orientation quaternion for each point can be applied to get the $\vec{r}_{rx}{}^i$, according to the equation:

$$r_{tip,rx}{}^i = M^{-1,i} * r_{rx}{}^i$$

The mean $\vec{r}_{tip,rx}{}^i$ for all i gives the calibration $\vec{r}_{tip,rx}$. Applying a linear RANSAC (RANdom SAmple Consensus) filter to the pointcloud eliminates erroneous data that could be introduced by accidentally moving the probe out of the via during calibration data collection.

PCB layout digestor. The PCB layout digestor, as the name suggests, is the pythonic entity responsible for parsing of the PCB layout file for the circuit board, and to track the projected position of the probe tip on the PCB layout. The PCB layout also has to deal with errands like understanding what orientation and position the PCB is placed at on the workbench.

PCB position and orientation estimation. Given that most electronic circuit boards are rigid and planar, it is relatively safe to assume that the PCB is of planar geometry. The 3D position and orientation of the PCB may be estimated by using the probe tip to estimate the 3D positions of three or more known vias on the PCB. The implementation of the algorithm is similar to that described in O. Sorkine, "Least-Squares Rigid Motion Using SVD," [Technical notes, vol. 120, p. 3, 2009].

The following procedure is used to collect PCB position estimation data:
1. The software picks three (or more) pre-defined vias.
2. The user respectively pushes the tip into the via and holds the probe in that position for about 5-7 seconds. The system collects the estimated position data for the probe tip as this is done.

While the PCB position and orientation could be described as a 3D position and 3D orientation, as the PCB features are described as 2D features on the PCB plane, it seemed appropriate to represent the PCB position and orientation as a 2D object on a 3D plane. This would allow the positions of the features of the PCB to be used in their native reference system.

The 3D plane ($P_{rx}$) is found in the reference frame of the transmitter using a simple least squares fit on the via position data. However, this plane is still represented in the frame of the transmitter. It is necessary to find a reference frame such that one of the major planes of the reference frame is co-planar with the PCB plane; this permits movement from 3D position to 2D position on the PCB plane by the means of a simple transformation. In order to do that, it is necessary to find three orthonormal unit vectors, ThreeMusketeers, such that two of them lie in the PCB plane. The following technique is used to find three orthonormal basis vectors.

1. Let $\overrightarrow{Athos}$, $\overrightarrow{Artagnan}$ be two of the three lines formed between the three vias selected for calibration. $\overrightarrow{Athos}$ forms the first of the three orthonormal unit vectors.

2. $\overrightarrow{Pathos} = \overrightarrow{Athos} \times \overrightarrow{Artagnan}$ gives $\overrightarrow{Pathos}$, the second element of ThreeMusketeers.

3. The third element of $\overrightarrow{Arhemis}$ is found to be $\overrightarrow{Pathos} \times \overrightarrow{Athos}$ Notice, that $\overrightarrow{Athos}$ and $\overrightarrow{Arhemis}$ are in the plane of the PCB, and $\overrightarrow{Pathos}$ is normal to it. Also note that the three vectors are represented in the reference frame of the transmitter. Any of the three arbitrary vias can be selected as the origin of the new reference frame $\vec{r}_{luckyvia,tx}$. Now, the representation of a position of a point p in this new reference frame can be computed as $$\vec{R}_{p,ThreeMusketeers} = [\overrightarrow{Athos}, \overrightarrow{Pathos}, \overrightarrow{Arhemis}] \times (\vec{R}_{p,tx} = \vec{r}_{luckyvia,tx})$$

Further, for points on the PCB plane, the component corresponding to $\overrightarrow{Pathos}$ can be dropped, providing a convenient 2D representation. However, it is still necessary to compensate for the scale, translation, and rotation between the PCB layout 2D frame of reference pcb and the 2D frame of reference fixed on the PCB plane: twoMusketeers.

Let $r_{twoMusketeers}{}^i$ be the position of a via in the twoMusketeers, and $r_{pcb}{}^i$ be the corresponding position in the PCB layout. The scaling can be obtained by simply comparing the mean distances between vias in both frames of reference, $$scale = \frac{\sum_{i,j \in (1,2,3), i \neq j} \left( \left| \overrightarrow{r_{pcb}^i} - \overrightarrow{r_{pcb}^j} \right| \right)}{\sum_{i,j \in (1,2,3), i \neq j} \left( \left| \overrightarrow{r_{twoMusketeers}^{i,mean}} - \overrightarrow{r_{twoMusketeers}^{j,mean}} \right| \right)}$$

where $\overrightarrow{r_{twoMusketeers}^{i,mean}}$ is the mean of all position estimates for via i.

The translation $\vec{r}_{fix}$ is obtained as the translation between the centroids of the scaled estimated position pointclouds and PCB layout via position pointclouds. The centroid for the pointcloud can be computed as:

$$\vec{r}_{fix} = \overrightarrow{r_{pcb}^{centroid}} - scale * \overrightarrow{r_{twoMusketeers}^{centroid}}$$

The centroids can be found using the following equation:

$$\overrightarrow{r^{centroid}} = \frac{\sum_{i=1}^{n} \vec{r}^i}{n}$$

The rotation can be obtained as follows:
1. Compute vectors for each via positioned around the centroid.

$$\vec{a}^i = \overrightarrow{r_{pcb}^i} - \overrightarrow{r_{pcb}^{centroid}}$$

and $$\vec{b}^i = scale * (\overrightarrow{r_{twoMusketeers}^i} - \overrightarrow{r_{twoMusketeers}^{centroid}})$$

2. Compute the 2×2 covariance matrix as:

$$S = XIY^T$$

where X, Y are 2×n matrices with $a^i$ and $b^i$ as their columns. I is a 2×2 identity matrix.

3. Compute the singular value decomposition $S = U\Sigma V^T$. The 2D rotation matrix is then obtained as:

$$R = VU^T.$$

At the end of PCB position estimation, the three parameters that define the position and orientation of the PCB are scale, $r_{fix}$, and R. Of course, the board needs to be rigidly held relative to the workbench during the process, otherwise another calibration needs to be performed. Conversely, another tracking device can be rigidly mounted to the board as well although with the Polhemus system, care needs to be taken of distortion from connections or ferros material in proximity to the sensors and EMI.

Probe tip projection on the PCB. The previously described values scale, $r_{fix}$, and R are used to project the probe tip position along the probe vector onto the PCB plane. The projected point is then transformed to the PCB layout reference system.

1. The projection of the probe tip on the PCB plane along the probe vector is:

$$\overrightarrow{R_{tx}^{projected}} = \overrightarrow{R_{tx}^{tip}} - ((\overrightarrow{R_{tx}^{tip}} - \overrightarrow{R_{tx}^{origin}}) \cdot \overrightarrow{Pathos_{tx}}) \overrightarrow{Pathos_{tx}}$$

where $\overrightarrow{R_{tx}^{projected}}$ is the projected point and $\overrightarrow{R_{tx}^{origin}}$ is the origin of the PCB plane, both expressed in the reference frame of the transmitter tx.

2. The $\overrightarrow{R_{tx}^{projected}}$ is transformed to the threeMusketeers frame of reference $\overrightarrow{R_{threeMusketeers}^{projected}}$ using $$\vec{R}_{p,ThreeMusketeers} = [\overrightarrow{Athos}, \overrightarrow{Pathos}, \overrightarrow{Arhemis}] \times (\vec{R}_{p,tx} - \vec{r}_{luckyvia,tx})$$

3. The $\overrightarrow{Pathos}$ component of $\overrightarrow{R_{threeMusketeers}^{projected}}$ is dropped to obtain the 2D point $\overrightarrow{R_{twoMusketeers}^{projected}}$ on the PCB plane.

4. The $\overrightarrow{R_{twoMusketeers}^{projected}}$ is transformed to PCB layout reference frame $\vec{R}_{pcb}$ by applying the scale, $r_{fix}$, and R computed in the previous section as $$\overrightarrow{R_{pcb}^{projected}} = R(scale * (\overrightarrow{R_{twoMusketeers}^{projected}} - \overrightarrow{R_{twoMusketeers}^{centroid}})) + \overrightarrow{R_{pcb}^{centroid}}.$$

PCB Feature map. The prototype system supports two types of PCB features: components and pins. For both types of features, maximum rectangular extents are computed based on the PCB top and bottom trace layers and are mapped to active GTK+ widgets. In the event of a probe event, the PCB coordinates of the probe tip projection are checked against the extents of all features of the PCB to find which feature to delegate the probe event to.

Figure 14A:
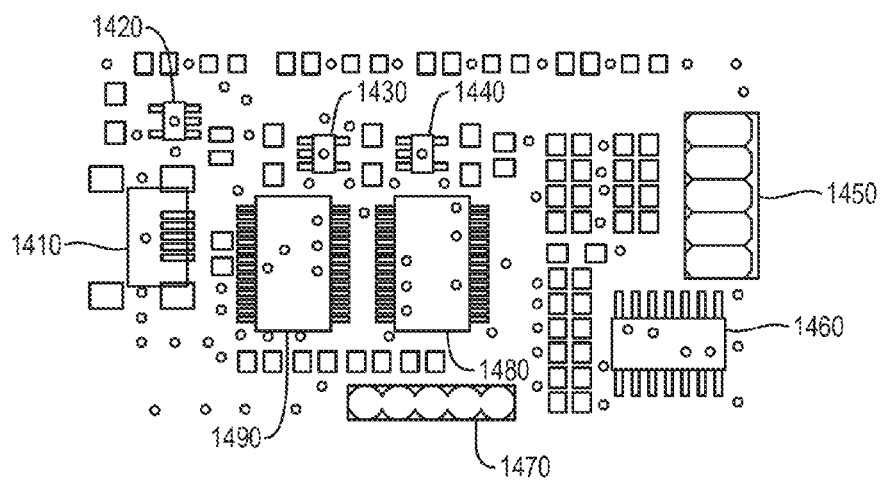
FIG. 14A is a screenshot of an exemplary map of PCB features and components that a prototype embodiment of the invention parsed from the PCB layout file for a circuit board.
Figure 14B:
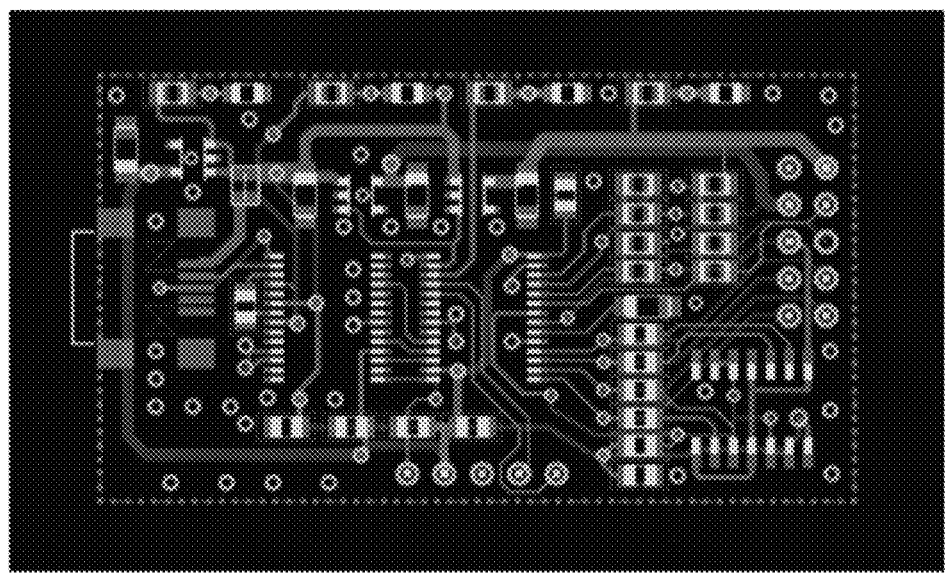
FIG. 14B is a screenshot of the PCB layout file used to obtain the example of FIG. 14A, as it appears in the third-party PCB layout software that was used to design the circuit board.
Figure 19:
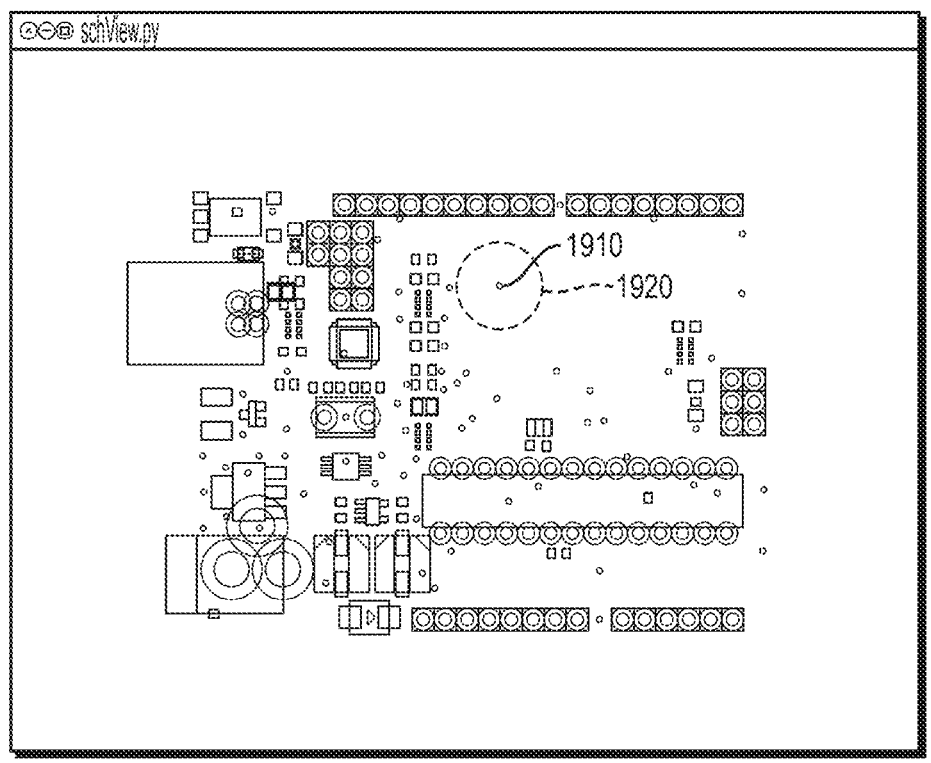
FIG. 19 is a screen shot of a display mapping the position of the probe tip to components on the circuit board of the example of FIGS. 15-18.

FIGS. 14A-B to 19 are screenshot files that display the state of the PCB Processor and the schematics display in different modes of operation of the system.

FIG. 14A is a screenshot of an exemplary map of PCB features and components that a prototype embodiment of the invention parsed from the PCB layout file for a circuit board. In FIG. 14A, rectangles 1410, 1420, 1430, 1440, 1450, 1460, 1470, 1480, 1490 depict PCB components, and the remaining rectangles depict component pins.

FIG. 14B is a screenshot of the PCB layout file used to obtain the example of FIG. 14A, as it appears in the third-party PCB layout software that was used to design the circuit board, the Eagle 6.0 Layout editor.

Figure 15:
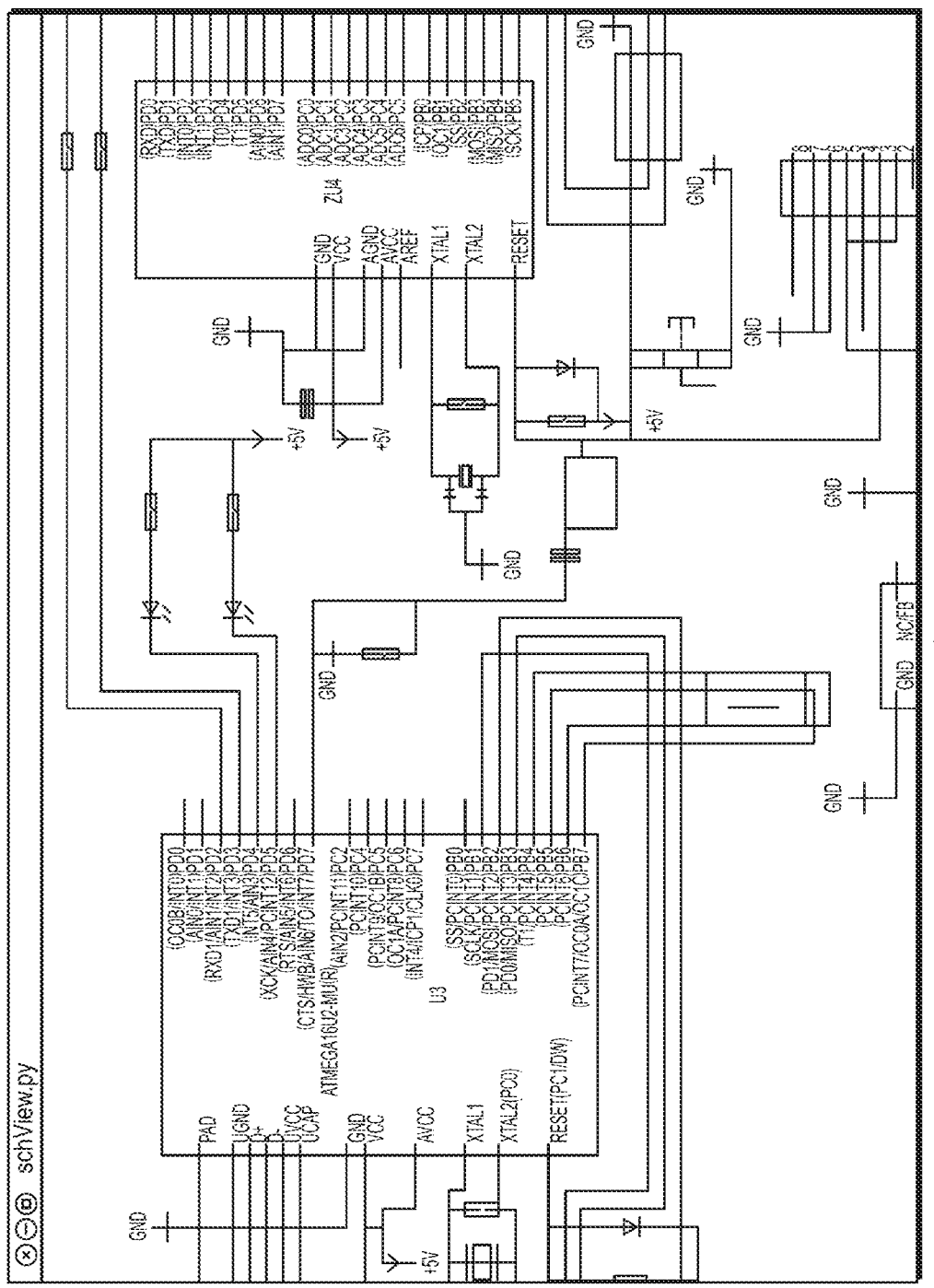
FIG. 15 is a screen shot of an exemplary pre-loaded connection schematic for a circuit board that was employed for schematic voltage annotation in an example created using a prototype embodiment of the invention.
Figure 16:
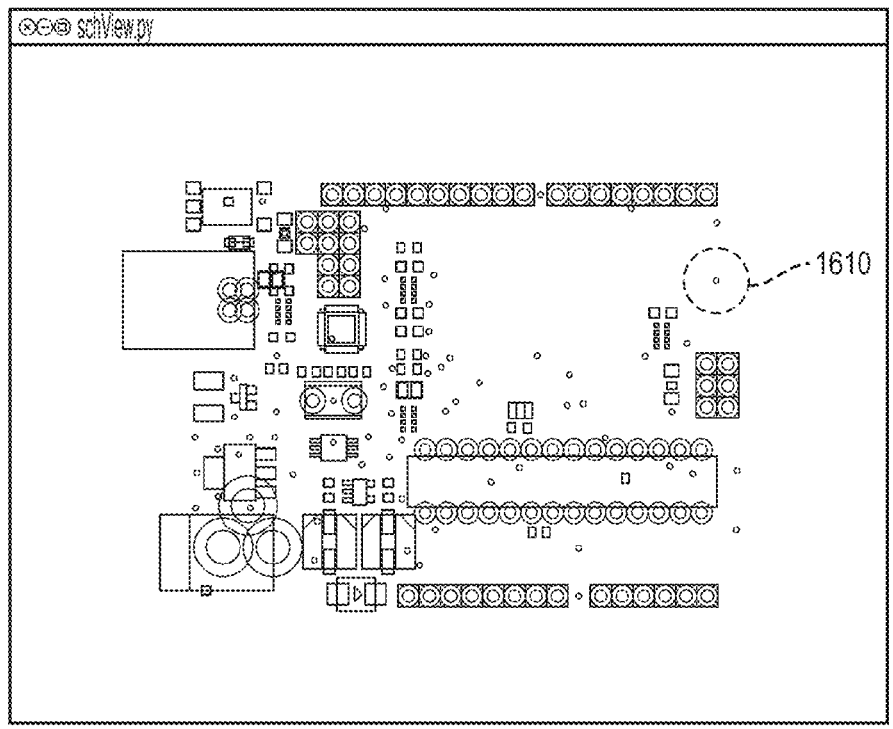
FIG. 16 is a screen shot of an exemplary map of PCB features and components during board-positioning mode produced for the example by a prototype embodiment of the invention.

FIG. 15 is a screen shot of an exemplary pre-loaded connection schematic for a circuit board that was employed for schematic voltage annotation in an example created using a prototype embodiment of the invention;

FIG. 16 is a screen shot of an exemplary map of PCB features and components during board-positioning mode produced for the example by a prototype embodiment of the invention. Dot 1610, as labelled, guides the user to the selected Via, to be pointed to by the device so that the system may collect positioning data.

Figure 17:
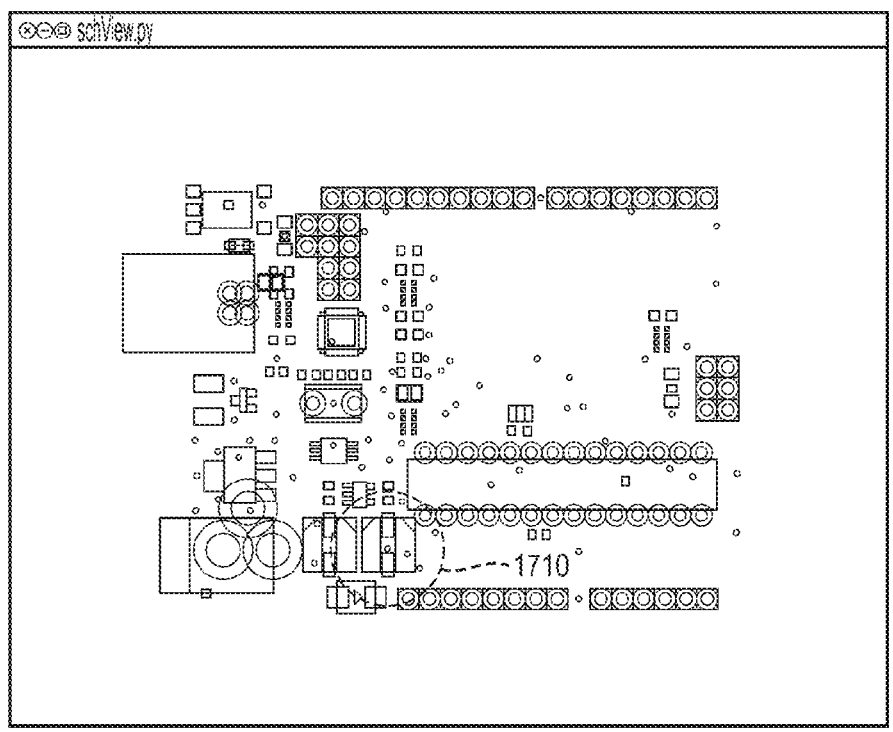
FIG. 17 is a screen shot of the exemplary map of PCB features and components of FIG. 16 during component select mode produced by a prototype embodiment of the invention.

FIG. 17 is a screenshot of the exemplary map of PCB features and components of FIG. 16 during component select mode produced by a prototype embodiment of the invention. The screenshot shows the PCB layout display in component select mode, with component 1710 having been successfully selected from the circuit board.

Figure 18:
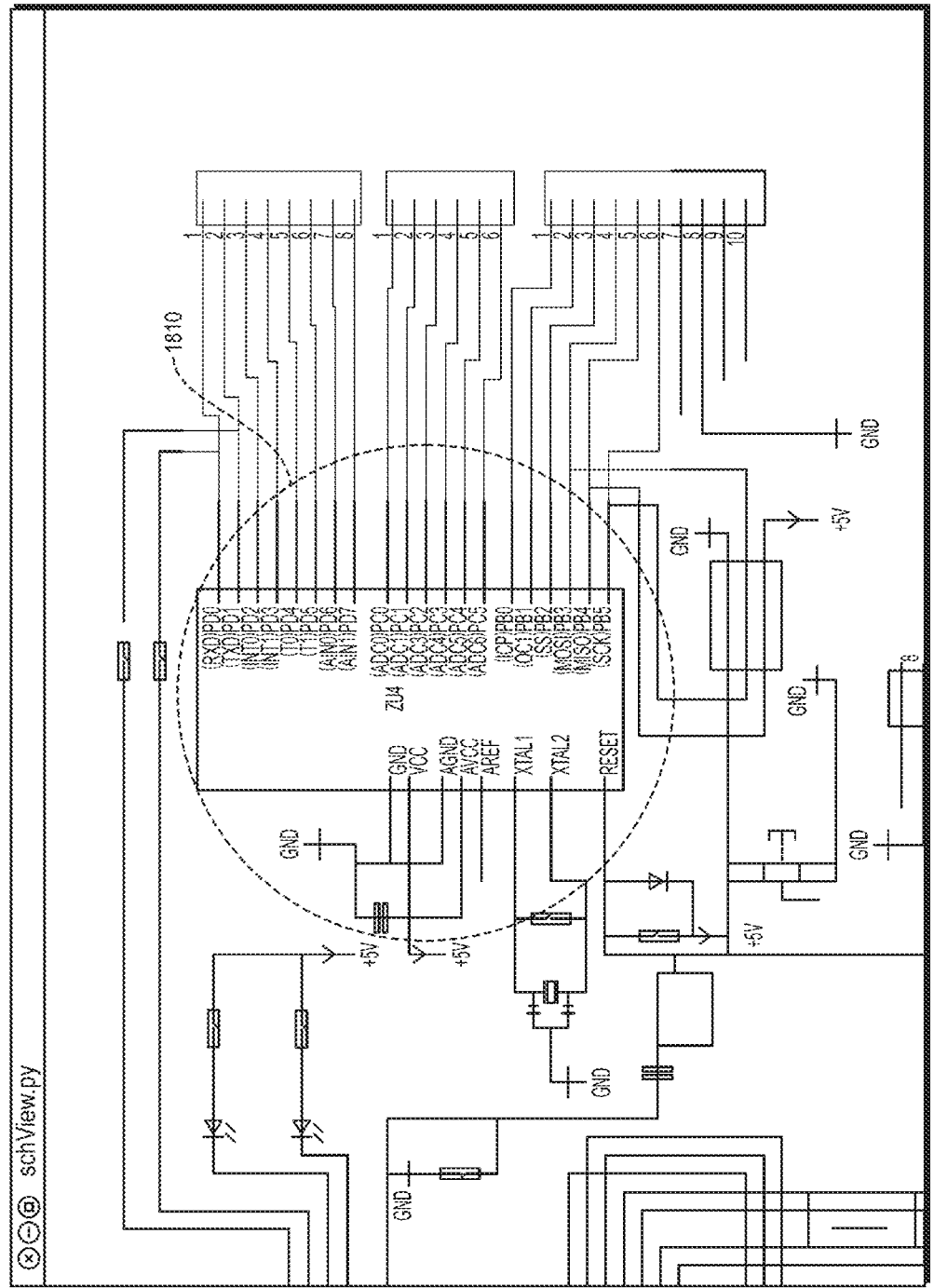
FIG. 18 is a screen shot of the exemplary connection schematic of FIG. 15 after the component has been successfully selected as shown in FIG. 17.

FIG. 18 is a screenshot of the exemplary connection schematic of FIG. 15 after the component has been successfully selected as shown in FIG. 17. The screenshot shows the schematics display, after the component 1810 has been successfully selected. The display is centered around component 1810, which is highlighted in red.

FIG. 19 is a screenshot of a display mapping the position of the probe tip to components on the circuit board of the example of FIGS. 15-18. The screenshot shows the estimated position 1910 of the probe tip on the circuit board. Circle 1920 is where the probe tip is estimated to be pointing.

As shown by the foregoing description and drawings, a system according to the invention assists the user with understanding, repairing, maintaining and/or designing electronic circuits. Among the advantages of a system according to the invention are that it provides a means to introspect the design data of a circuit board using the circuit board under work itself as the interface, that the system permits annotation of the connection schematics with the measurements made on the electronic circuit, and that it permits displaying the actual measurements against the expected measurements generated by a computer simulation.

While a preferred embodiment is disclosed, many other implementations will occur to one of ordinary skill in the art and are all within the scope of the invention. Each of the various embodiments described above may be combined with other described embodiments in order to provide multiple features. Furthermore, while the foregoing describes a number of separate embodiments of the apparatus and method of the present invention, what has been described herein is merely illustrative of the application of the principles of the present invention. Other arrangements, methods, modifications, and substitutions by one of ordinary skill in the art are therefore also considered to be within the scope of the present invention, which is not to be limited except by the claims that follow.

What is claimed is:

1. An electronic design system for introspection and annotation of electronic design data, comprising:
   a probe configured for direct interaction with an electronic circuit, the probe comprising a pointing tip and at least one tracking sensor for tracking a position of the probe within the electronic circuit;
   a tracking system configured to receive data from the tracking sensor and to translate the received data into probe coordinates reflecting the position of the probe within the electronic circuit;
   a memory storage unit containing at least one stored electronic circuit schematic, design file, or model for the electronic circuit;

a special-purpose computer processor, the computer processor comprising:
  electronic design system software specially configured to:
    receive the probe coordinates from the tracking system;
    locate the position of the probe on the electronic circuit schematic, design file, or model;
    identify, using the located position, a component of the electronic circuit that is interacting with the probe; and
    create a display of information about the identified component; and
  a user interface specially configured to present the display of information created by the electronic design system software to a user.

2. The electronic design system of claim 1, wherein the display of information includes an annotated version of the electronic circuit schematic, design file, or model.

3. The electronic design system of claim 1, wherein the probe further comprises at least one user interface device.

4. The electronic design system of claim 3, further comprising at least one measurement device or instrumentation device, wherein the probe further comprises at least one electronic circuit parameter measurement device, and wherein the electronic design system software is further specially configured to receive electronic circuit parameter measurements from the measurement device or the instrumentation device.

5. The electronic design system of claim 4, wherein the display of information includes information derived from the received electronic circuit parameter measurements.

6. The electronic design system of claim 4, wherein the electronic design system software is further configured to process the received electronic circuit parameter measurements.

7. The electronic design system of claim 5, wherein the display of information includes an annotated version of the electronic circuit schematic, design file, or model that includes information derived from the received electronic circuit parameter measurements.

8. The electronic design system of claim 1, further comprising at least one of a stored component data sheet or a source code listing for the electronic circuit.

9. The electronic design system of claim 1, further comprising an interface to electronic design automation or computer-aided design software configured for producing the stored electronic circuit schematic, design file, or model for the electronic circuit.

10. The electronic design system of claim 9, wherein the computer processor comprises the electronic design automation or computer-aided design software and stored electronic circuit schematic, design file, or model for the electronic circuit.

11. The electronic design system of claim 1, wherein the tracking sensor employs magnetic or optical sensing.

12. A probe for an electronic design system for introspection and annotation of electronic design data, comprising:
  at least one pointing tip; and
  at least one tracking sensor for tracking a position of the probe within an electronic circuit and providing information of the position to a tracking system configured to receive data from the tracking sensor and to translate the received data into coordinates reflecting the position of the probe within the electronic circuit.

13. The probe of claim 12, further comprising at least one electronic circuit parameter measurement device.

14. The probe of claim 12, further comprising at least one user interface device.

15. An electronic design system, comprising:
  electronic design system software running on a special-purpose computer processor, the electronic design system software being specially configured to:
    receive coordinates for a location of a tracking probe that is directly interacting with an electronic circuit;
    locate a position of the tracking probe on an electronic circuit schematic, design file, or model of the electronic circuit;
    identify, using the located position, at least one component of the electronic circuit that is interacting with the tracking probe; and
    create a display of information about the identified component of the electronic circuit.

16. The electronic design system of claim 15, further comprising a user interface specially configured to present the display of information created by the electronic design system software to a user.

17. The system of claim 15, wherein the display of information includes an annotated version of the electronic circuit schematic, design file, or model.

18. The electronic design system of claim 15, wherein the electronic design system software is further specially configured to receive electronic circuit parameter measurements obtained from the electronic circuit by at least one electronic circuit parameter measurement device.

19. The electronic design system of claim 18, wherein the display of information includes information derived from the received electronic circuit parameter measurements.

20. The electronic design system of claim 19, wherein the display of information includes an annotated version of the electronic circuit schematic, design file, or model that includes information derived from the received electronic circuit parameter measurements.

* * * * *